United States Patent
Hamada et al.

(10) Patent No.: US 7,141,823 B2
(45) Date of Patent: Nov. 28, 2006

(54) THIN FILM TRANSISTOR SEMICONDUCTOR DEVICE

(75) Inventors: Takashi Hamada, Atsugi (JP); Hidekazu Miyairi, Atsugi (JP); Takuya Matsuo, Tondabayashi (JP); Naoki Makita, Nara (JP); Katsumi Nomura, Tenri (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 308 days.

(21) Appl. No.: 10/254,670

(22) Filed: Sep. 26, 2002

(65) Prior Publication Data

US 2003/0062546 A1   Apr. 3, 2003

(30) Foreign Application Priority Data

Sep. 27, 2001   (JP)   ............................. 2001-295641

(51) Int. Cl.
*H01L 31/072*   (2006.01)
(52) U.S. Cl. ......................................... 257/72; 257/344
(58) Field of Classification Search .................. 257/72, 257/344, 61, 401, 408, 412, 71, 347
See application file for complete search history.

(56) References Cited

U.S. PATENT DOCUMENTS

| 5,698,882 | A | * | 12/1997 | Park | .......................... | 257/344 |
| 5,757,048 | A | * | 5/1998 | Inoue | ........................ | 257/344 |
| 6,559,036 | B1 | | 5/2003 | Ohtani et al. | | |
| 6,596,571 | B1 | * | 7/2003 | Arao et al. | .................. | 438/163 |
| 6,613,620 | B1 | | 9/2003 | Fujimoto et al. | | |
| 6,624,473 | B1 | * | 9/2003 | Takehashi et al. | .......... | 257/344 |
| 6,759,678 | B1 | | 7/2004 | Yamazaki et al. | | |
| 6,803,296 | B1 | | 10/2004 | Miyairi | | |

| 2001/0036692 | A1 | 11/2001 | Yamazaki et al. |
| 2001/0041392 | A1 | 11/2001 | Suzawa et al. |
| 2001/0052950 | A1 | 12/2001 | Yamazaki et al. |
| 2002/0013114 | A1 | 1/2002 | Ohtani et al. |
| 2002/0110941 | A1 | 8/2002 | Yamazaki et al. |
| 2002/0164843 | A1 | 11/2002 | Yamazaki et al. |
| 2002/0182785 | A1 | 12/2002 | Miyairi |

(Continued)

FOREIGN PATENT DOCUMENTS

| JP | 08-078329 | 3/1996 |
| JP | 08-255916 | 10/1996 |

(Continued)

OTHER PUBLICATIONS

Katsuyuki Suga et al., *P-3: The Effect of a Laser Annealing Ambient on the Morphology and TFT Performance of Poly-Si Films*. SID Digest. pp. 534-537, 2000.

(Continued)

*Primary Examiner*—David Nelms
*Assistant Examiner*—Thinh T Nguyen
(74) *Attorney, Agent, or Firm*—Eric J. Robinson; Robinson Intellectual Property Law Office, P.C.

(57) ABSTRACT

In a TFT with a GOLD structure, there is provided a structure which is able to improve an operating characteristic and reliability and reduce an off current value in order to reduce power consumption of a semiconductor device. The surface of LDD region (4) overlapped with a portion (7a) of a gate electrode through a gate insulating film (6) interposed therebetween is extremely flattened. Thus, it is possible to obtain a TFT structure which is capable of reducing a parasitic capacitance in the LDD region of the TFT with the GOLD structure, reducing an off current value, improving reliability, and enabling high speed operation.

53 Claims, 21 Drawing Sheets

U.S. PATENT DOCUMENTS

2002/0187594 A1 12/2002 Yamazaki et al.
2004/0072393 A1 4/2004 Yamazaki et al.

FOREIGN PATENT DOCUMENTS

| JP | 10-200120 | 7/1998 |
| JP | 2001-60551 | 3/2001 |
| JP | 2001-093598 | 4/2001 |
| JP | 2003-051446 | 2/2003 |

OTHER PUBLICATIONS

Specification, claims, abstract, and drawings of U.S. Appl. No. 09/894,125 filed Jun. 29, 2001.

Specification, Claims, Abstract and Drawings of U.S. Appl. No. 09/352,198 filed Jul. 13, 1999 entitled Crystalline Semiconductor Thin Film, Method of Fabricating the Same, Semiconductor Device, and Method of Fabricating the Same.

* cited by examiner

1st TFT          2nd TFT

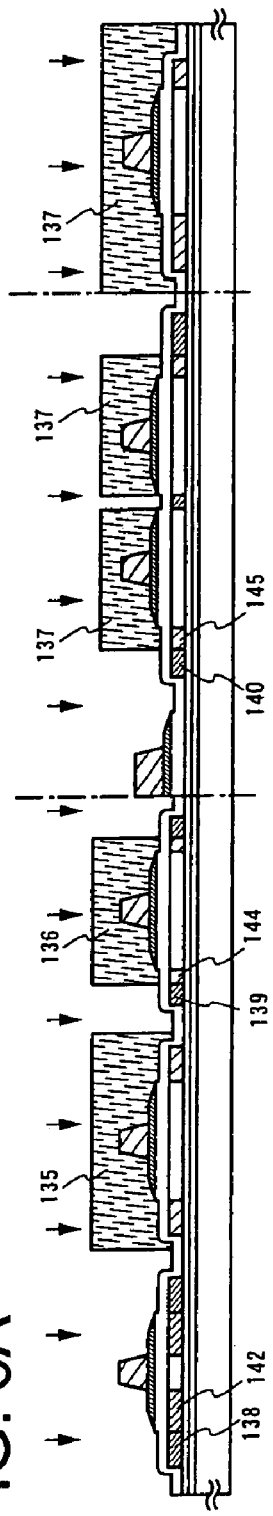
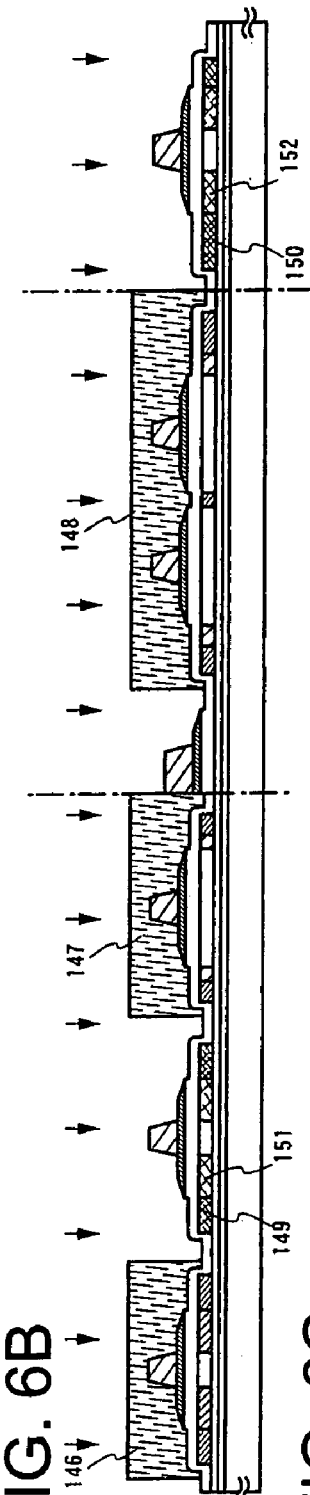
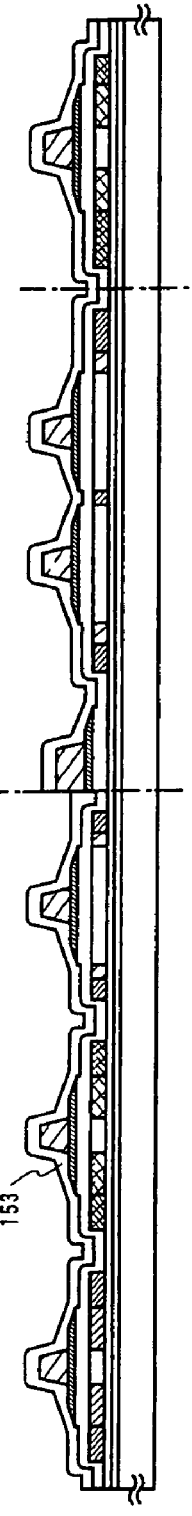

300nm

Gl: 80nm
Vd: 16V
Time: 100sec

Gl: 80nm
Vd: 16V
Time: 100sec

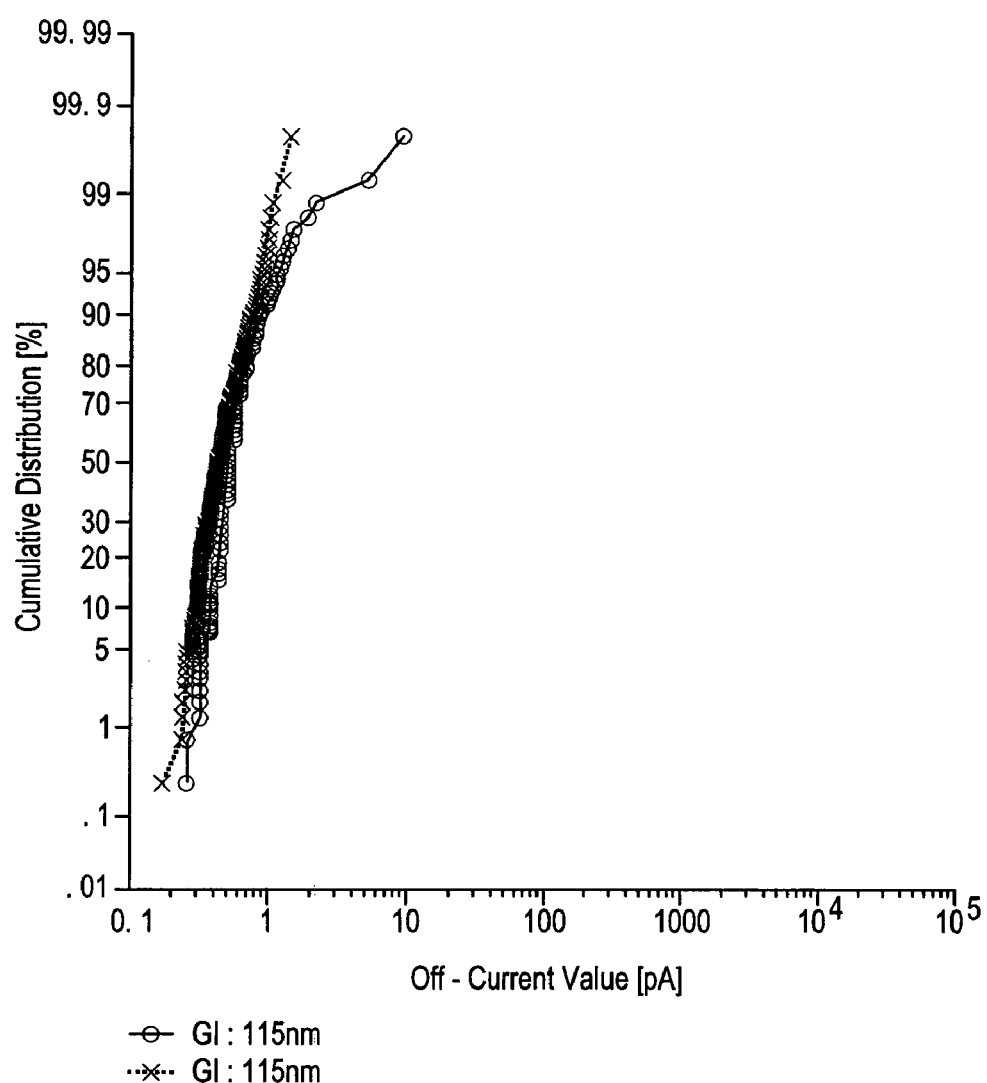

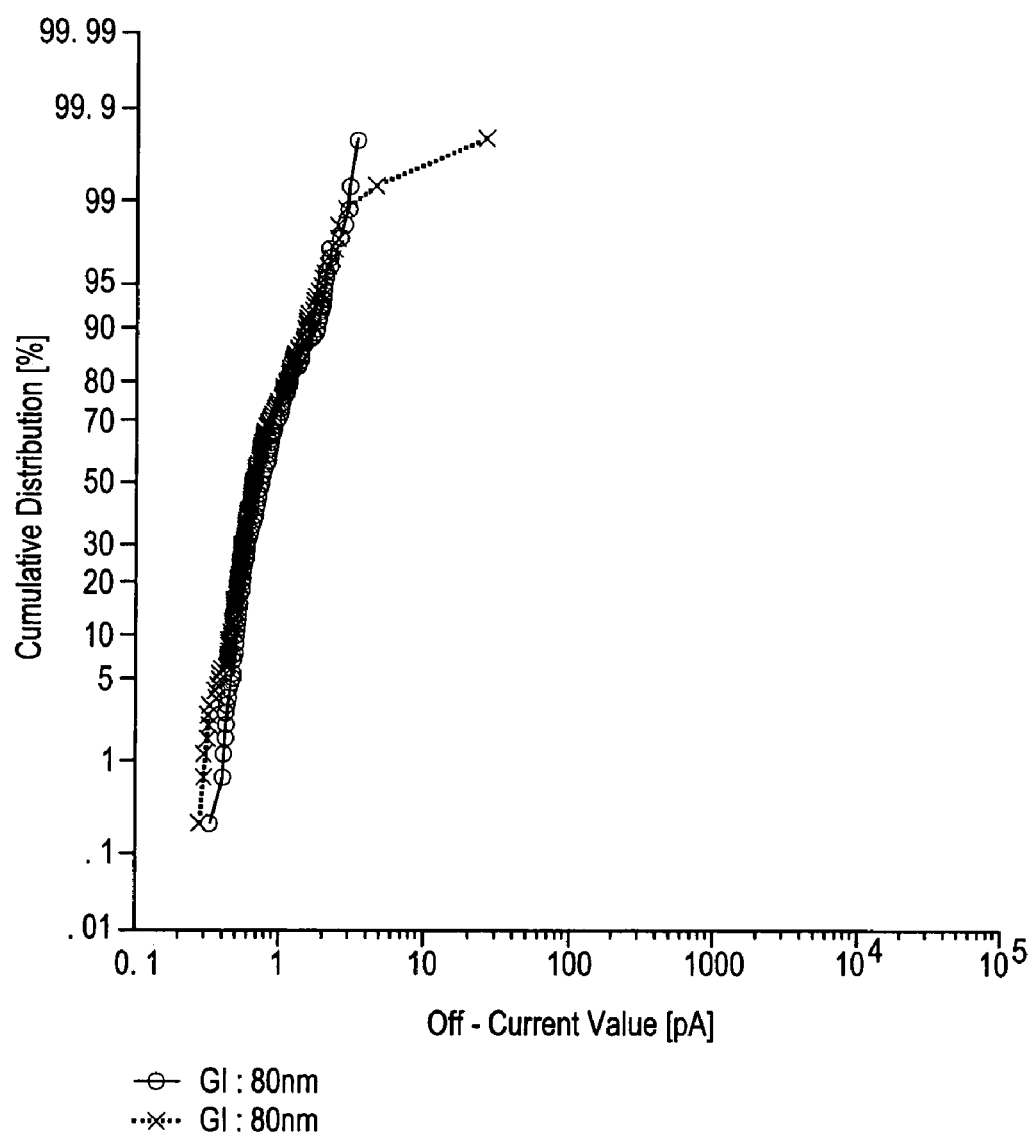

300nm

THIN FILM TRANSISTOR SEMICONDUCTOR DEVICE

BACKGROUND OF THE INVENTION

1. Field of the Invention

The present invention relates to a semiconductor device which has a circuit composed of a thin film transistor (hereinafter referred to as a TFT) and a manufacturing method thereof. The present invention relates to, for example, an electro-optical device typified by a liquid crystal display panel and an electronic device in which such an electro-optical device is mounted as a component.

Note that in this specification, a semiconductor device indicates, in general, a device which functions by utilizing characteristics of a semiconductor, and an electro-optical device, a semiconductor circuit, and an electronic device are each a semiconductor device.

2. Description of the Related Art

In recent years, the development of a semiconductor device has progressed. The semiconductor device has a large area integrated circuit manufactured by using a thin film transistor (TFT) composed of a semiconductor thin film (about several nm to several hundred nm in thickness) formed on a substrate having an insulating surface. An active matrix liquid crystal module is known as a typical example thereof. In particular, since a TFT using a crystalline silicon film (typically, a polysilicon film) as an active layer (hereinafter referred to as a polysilicon TFT) has high field effect mobility, it is also capable to form a circuit with various functions.

For example, in a liquid crystal module mounted in a liquid crystal display device, a pixel circuit for displaying an image in each functional block and a driver circuit for controlling the pixel circuit, which includes a shift register circuit, a level shifter circuit, a buffer circuit, a sampling circuit, and the like using CMOS circuits as fundamental circuits, which are formed on a single substrate.

Furthermore, in the pixel circuit of the active matrix liquid crystal module, TFTs (pixel TFTs) are arranged in each of the several tens to several millions of pixels, and a pixel electrode is provided in each of the pixel TFTs. A counter electrode is provided at a counter substrate side with sandwiching liquid crystals to form a kind of capacitor using the liquid crystals as a dielectric. Then, voltage applied to each of the pixels is controlled by a switching function of the TFT to control a charge to the capacitor and drive the liquid crystals, and the amount of transmitting light is control to display an image.

The pixel TFT is made from an n-channel TFT and is used as a switching element for applying voltage to liquid crystals and driving. Since the liquid crystals are driven by an alternating current, a method called a frame inversion drive is employed in many cases. In this method, in order to suppress the power consumption, it is important to sufficiently reduce an off current value (drain current flowing when the TFT is in an off operation state) as a characteristic required for the pixel TFT.

A low concentration drain (LDD: lightly doped drain) structure has been known as a structure of a TFT for reducing an off current value. According to this structure, a region to which an impurity element is added at a low concentration is provided between a channel formation region and a source region or a drain region which is formed by adding an impurity element at a high concentration, and the region is called an LDD region. An LDD structure is effective in preventing deterioration due to hot carrier injection by relaxing an electric field in the vicinity of a drain.

In the case where an LDD region is formed using a conventional TFT, an off current value could be reduced. However, an on current value also decreased.

Further, a GOLD (gate-drain overlapped LDD) structure in which an LDD region and a gate electrode are arranged so as to overlap with each other through a gate insulating film is known as means for preventing deterioration of an on current value due to hot carriers. Compared to an LDD structure, the GOLD structure is much more effective in preventing deterioration due to hot carrier injection by relaxing the electric field in the vicinity of a drain. Note that in this specification, a TFT structure in which a gate electrode and an LDD region overlap with each other through a gate insulating film is called a GOLD structure and a TFT structure in which a gate electrode and an LDD region do not overlap with each other through a gate insulating film, is called an LDD structure.

Although the GOLD structure is more effective in preventing deterioration of an on current value compared with an LDD structure, on the other hand, there is a problem that an off current value becomes large in the GOLD structure compared with the LDD structure.

Further, since an LDD region and a gate electrode are arranged so as to overlap with each other through a gate insulating film in the GOLD structure, a parasitic capacity occurred and the frequency characteristic (called f characteristic) decreased, thereby obstructing high speed operation.

In addition, in the case where a storage capacitor is formed in the pixel portion using a semiconductor layer as one of electrodes, a problem of leak current becomes greater.

As described above, in a semiconductor device which has a plurality of integrated circuits such as an active matrix liquid crystal display device, the above problem is more emphasized particularly in a crystalline silicon TFT as the performance required for the active matrix liquid crystal display device is enhanced.

SUMMARY OF THE INVENTION

The present invention is a technique for solving such problems. An object of the present invention is therefore to improve operating characteristics and reliability of a semiconductor device and to realize low power consumption in an electro-optical device and a semiconductor device typified by an active matrix liquid crystal display device manufactured from a TFT with a GOLD structure.

In particular, an object of the present invention is to obtain a structure of a TFT which has a low off current value. In addition, an object of the present invention is to obtain a structure of a TFT which has a high ratio of an on current value to an off current value.

Also, an object of the present invention is to reduce a parasitic capacitance of the TFT which has the GOLD structure, thereby to obtain a structure of a TFT in which high speed operation thereof can be attained.

Also, an object of the present invention is to suppress a leak current when a storage capacitor using a semiconductor layer as one of electrodes is formed in a pixel portion.

In order to solve the above-mentioned problems, a lot of experiments and examinations from various angles are repeatedly performed. As a result, an LDD region which has a surface with superior flatness is formed, whereby a TFT with a GOLD structure, which has extremely high electrical characteristics and reliability, can be obtained.

According to a first structure of the present invention disclosed in this specification, there is provided a semiconductor device comprising a TFT comprising: a gate electrode; a gate insulating film; a channel formation region; a drain region; a source region; and an LDD region which is overlapped with the gate electrode through the gate insulating film interposed therebetween and located between the channel formation region and one of the drain region and the source region, wherein a surface of the LDD region is flat.

In the above-mentioned structure, the device is characterized in that a P-V value indicating a degree of flatness on the surface of the LDD region is 50 nm or less. In addition, in the above-mentioned structure, the LDD region may be overlapped with the gate electrode through the gate insulating film or may not be overlapped therewith. When the LDD region is overlapped with the gate electrode through the gate insulating film, a width of the LDD region overlapped with the gate electrode is 0.5 µm to 1.5 µm.

According to a second structure of the present invention, in the case where a gate electrode has a laminate structure, there is provided a semiconductor device comprising a TFT comprising: a gate electrode; a gate insulating film; a channel formation region; a drain region; a source region; and an LDD region which is overlapped with the gate electrode through the gate insulating film interposed therebetween and located between the channel formation region and one of the drain region and the source region, wherein the gate electrode comprises a laminate of a first conductive layer and a second conductive layer with a smaller width than the first conductive layer, the channel formation region is overlapped with the second conductive layer through the first conductive layer and the gate insulating film, wherein the LDD region is overlapped with the first conductive layer through the gate insulating film, and a surface of the LDD region is flat.

According to a third structure of the present invention, in the case where a part of the LDD region is overlapped with the laminated gate electrode through the gate insulating film interposed therebetween, there is provided a semiconductor device comprising a TFT comprising: a gate electrode; a gate insulating film; a channel formation region; a drain region; a source region; and an LDD region which is overlapped with the gate electrode through the gate insulating film interposed therebetween and located between the channel formation region and one of the drain region and the source region, wherein the gate electrode comprises a laminate of a first conductive layer and a second conductive layer with a smaller width than the first conductive layer, the channel formation region is overlapped with the second conductive layer through the first conductive layer and the gate insulating film, a portion of the LDD region is overlapped with the first conductive layer through the gate insulating film, and a surface of the LDD region is flat.

Also, according to a fourth structure of the present invention, in the case where LDD region is overlapped with the laminated gate electrodes (with the different taper angles) through the gate insulating film interposed therebetween, there is provided a semiconductor device comprising a TFT comprising: a gate electrode; a gate insulating film; a channel formation region; a drain region; a source region; and an LDD region which is overlapped with the gate electrode through the gate insulating film interposed therebetween and located between the channel formation region and one of the drain region and the source region, wherein the gate electrode comprises a laminate of a first conductive layer and a second conductive layer which has a smaller width than the first conductive layer and a larger taper angle than the first conductive layer, the channel formation region is overlapped with the second conductive layer through the first conductive layer and the gate insulating film, the LDD region is overlapped with the first conductive layer through the gate insulating film, and has a concentration distribution in which an impurity concentration is increased as a distance from the channel formation region is increased, and a surface of the LDD region is flat.

Also, in any one of the above-mentioned first to fourth structures of the present invention, a semiconductor device is characterized in that a P-V value indicating a degree of flatness on the surface of the LDD region is 50 nm or less.

Also, in any one of the above-mentioned second to fourth structures of the present invention, a semiconductor device is characterized in that a width of the first conductive layer overlapped with the LDD region through the gate insulating film is 0.5 µm to 1.5 µm.

According to a fifth structure of the present invention, in the case where a plurality of TFT which have LDD regions different widths is provided on the same substrate, there is provided a semiconductor device comprising a plurality of TFTs each comprising: a gate electrode; a gate insulating film; a channel formation region; a drain region; a source region; and an LDD region which is overlapped with the gate electrode through the gate insulating film interposed therebetween and located between the channel formation region and one of the drain region and the source region, wherein the plurality of TFTs comprises at least a first TFT and a second TFT, a width of the LDD region of the first TFT is different from at of the second TFT, the width of the LDD region of the first TFT is wider than that of the second TFT, and surfaces of the LDD regions of + the first and second TFTs are flat. Also, according to a sixth structure of the present invention, in the case where a plurality of TFTs which have LDD regions with different widths on the same substrate is provided in the pixel portion and the driver circuit, there is provided a semiconductor device comprising a pixel portion and a driver circuit, wherein each of a TFT of the driver circuit and a TFT of the pixel portion comprises a gate electrode, a gate insulating film, a channel formation region, a drain region, a source region, and an LDD region between the channel formation region and one of the drain region and the source region, wherein the LDD region is overlapped with the gate electrode through the gate insulating film interposed therebetween, a width of the LDD region of the TFT of the driver circuit is wider than that of the pixel portion, and surfaces of the LDD regions of the TFT of the driver circuit and the TFTs of the pixel portion are flat.

Also, in the above-mentioned fifth or the sixth structure of the present invention, a semiconductor device is characterized in that a P-V value indicating a degree of flatness on the surface of the LDD region is 50 nm or less. Also, in the above-mentioned fifth or the sixth structure of the present invention, a semiconductor device is characterized in that a width of the gate electrode overlapped with the LDD region through the gate insulating film is 0.5 µm to 1.5 µm. Also, in the above-mentioned fifth or the sixth structure of the present invention, a semiconductor device is characterized in that the gate electrode is composed of a laminate of a first conductive layer and a second conductive layer having a smaller width and a larger taper angle than the first conductive layer.

Also, in any one of the above-mentioned second to sixth structures of the present invention, a semiconductor device is characterized in that a film thickness of the first conductive layer is 20 nm to 100 nm. Also, in any one of the above-mentioned second to sixth structures of the present invention, a semiconductor device is characterized in that a film thickness of the second conductive layer is 100 nm to 500 nm.

Also, in order to achieve the above-mentioned sixth structure, according to a structure of the present invention concerning the manufacturing method, there is provided a method of manufacturing a semiconductor device comprising a first TFT and a second TFT, comprising:

forming a semiconductor film having a crystalline structure on an insulating surface;

leveling a surface of the semiconductor film;

forming a first semiconductor layer and a second semiconductor layer from the leveled semiconductor layer;

forming an insulating film on the first semiconductor layer and the second semiconductor layer;

forming a first gate electrode having a taper portion on the insulating film;

forming a second gate electrode having a taper portion which has a different width from that of the first gate electrode; and adding an impurity element having one of an n-type and a p-type to the first semiconductor layer through the taper portion of the first gate electrode to form a first impurity region and adding an impurity element having one of an n-type and a p-type to the second semiconductor layer through the taper portion of the second gate electrode to form a second impurity region.

Also, in the above-mentioned structure concerning the manufacturing method, a semiconductor device is characterized in that each of the first gate electrode and the second gate electrode has a laminate structure in which a first conductive layer having a first width is a lower layer and a second conductive layer having a second width which is narrower than the first width is an upper layer.

Also, according to a seventh structure of the present invention, in the case where a capacitor which has a semiconductor layer as one of its electrodes is provided, there is provided a semiconductor device comprising: a TFT comprising a gate electrode, an insulating film, a channel formation region, a drain region, and a source region; and a storage capacitor, wherein the storage capacitor comprises the insulating film as a dielectric, an electrode comprising a laminate of a first conductive layer and a second conductive layer with a smaller width than the first conductive layer, and a semiconductor layer, and a surface of a region of the semiconductor layer which is overlapped with the electrode through the insulating film interposed therebetween is flat.

Also, in the above-mentioned seventh structure, a semiconductor device is characterized in that the semiconductor layer is made of the same material as one of the channel formation region, the drain region, and the source region. Also, in the above-mentioned seventh structure, a semiconductor device is characterized in that the electrode is made of the same material as the gate electrode.

Also, according to an eighth structure of the present invention, in the case where a TFT and a storage capacitor is provided on the same substrate, there is provided a semiconductor device comprising: a TFT comprising a gate electrode, an insulating film, a channel formation region, a drain region, a source region, and an LDD region between the channel formation region and one of the drain region and the source region; and a storage capacitor, wherein the LDD region is overlapped with the gate electrode through the insulating film interposed therebetween, the pixel portion further comprises a pixel electrode electrically connected with one of the drain region and the source region, the storage capacitor in a pixel comprises the insulating film as a dielectric, a semiconductor layer electrically connected with the pixel electrode, and an electrode electrically connected with a gate wiring of an adjacent pixel, and a surface of the semiconductor layer electrically connected with the pixel electrode and a surface of the LDD region are flat.

Also, in the above-mentioned seventh or eighth structure of the present invention, a semiconductor device is characterized in that a P-V value indicating a degree of flatness on the surface of the semiconductor layer is 50 nm or less.

Also, in order to achieve the above-mentioned seventh or eighth structure, according to a structure of the present invention concerning the manufacturing method, there is provided a method of manufacturing a semiconductor device comprising a TFT and a storage capacitor, comprising:

forming a semiconductor film having a crystalline structure on an insulating surface;

leveling a surface of the semiconductor film;

forming a first semiconductor layer and a second semiconductor layer from the leveled semiconductor layer;

forming an insulating film on the first semiconductor layer and the second semiconductor layer;

forming a gate electrode having a taper portion on the insulating film;

forming an electrode having a taper portion; and adding an impurity element having one of an n-type and a p-type to the first semiconductor layer through the taper portion of the gate electrode to form a first impurity region and adding an impurity element having one of an n-type and a p-type to the second semiconductor layer through the taper portion of the gate electrode to form a second impurity region.

Also, in the above-mentioned manufacturing method, the method is characterized in that the storage capacitor is formed from the insulating film as a dielectric, the electrode, and the second semiconductor layer. Also, in the above-mentioned manufacturing method, the method is characterized in that each of the gate electrode and the electrode has a laminate structure in which a first conductive layer having a first width is a lower layer and a second conductive layer having a second width narrower than the first width is an upper layer. Also, in the above-mentioned manufacturing method, the method is characterized in that the step of leveling the surface of the semiconductor film includes: heating a semiconductor film having an amorphous structure and then removing a first oxide film on the surface of the semiconductor film; irradiating laser light to form a semiconductor film having a crystalline structure and a second oxide film thereon; removing the second oxide film; and irradiating laser light in one of an inert gas atmosphere and a vacuum to flatten the surface of the semiconductor film. Also, the method is characterized in that the step of leveling the surface of the semiconductor film is conducted by a chemical mechanical polishing method.

Also, according to a ninth structure of the present invention, in the case where a gate electrode is provided which is overlapped with the LDD region, there is provided a semiconductor device comprising a TFT comprising: a gate electrode; a gate insulating film; a channel formation region; a drain region; a source region; and an LDD region between the channel formation region and one of the drain region and the source region, wherein the LDD region is overlapped with the gate electrode through the gate insulating film interposed therebetween, a boundary between a portion of the gate electrode overlapped with the LDD region and the gate insulating film is flat.

Note that in the above-mentioned ninth structure, a surface of the LDD region is flat and a P-V value indicating a degree of flatness on the surface of the semiconductor layer is 50 nm or less.

BRIEF DESCRIPTION OF THE DRAWINGS

In the accompanying drawings:

FIGS. 6A to 6C show steps of manufacturing the active matrix substrate;

FIG. 12 is a graph showing off current values in TFTs with L/W=2/8 (in which the film thickness of the gate insulating film is 115 nm);

FIG. 13 is a graph showing off current values in TFTs with L/W=2/8 (in which the film thickness of the gate insulating film is 80 nm);

DETAILED DESCRIPTION OF THE PREFERRED EMBODIMENTS

Hereinafter, embodiment modes of the present invention will be described.

While experiments and examinations are greatly and repeatedly performed, the present inventors found that an unevenness on a surface of an LDD region in a TFT with a GOLD structure is a cause to increase an off current value and a cause to reduce reliability. A main cause of the unevenness on the surface of the LDD region is a ridge produced during irradiation of laser light conducted in a TFT manufacturing process. A height of the ridge formed by laser light is about 100 nm and when it is considered that a thickness of a gate insulating film is 100 nm, the unevenness on the surface of the LDD region becomes very large.

Also, it is considered that the unevenness on the surface of the LDD region of the TFT with GOLD structure becomes a portion into which a hot carrier is easily injected and this causes reduction in reliability of the TFT. In addition, it is considered that the gate insulating film is deformed by stress due to the presence of the unevenness on the surface of the LDD region of the TFT with GOLD structure, a state in which a hot carrier is easily injected is obtained, and this causes reduction in reliability of the TFT.

Also, the LDD region is overlapped with the gate electrode in the GOLD structure. If the unevenness is caused on the LDD region, a thin portion of the gate insulating film is locally formed, thereby to reduce a withstand voltage and increase a parasitic capacitance.

Figure 1:
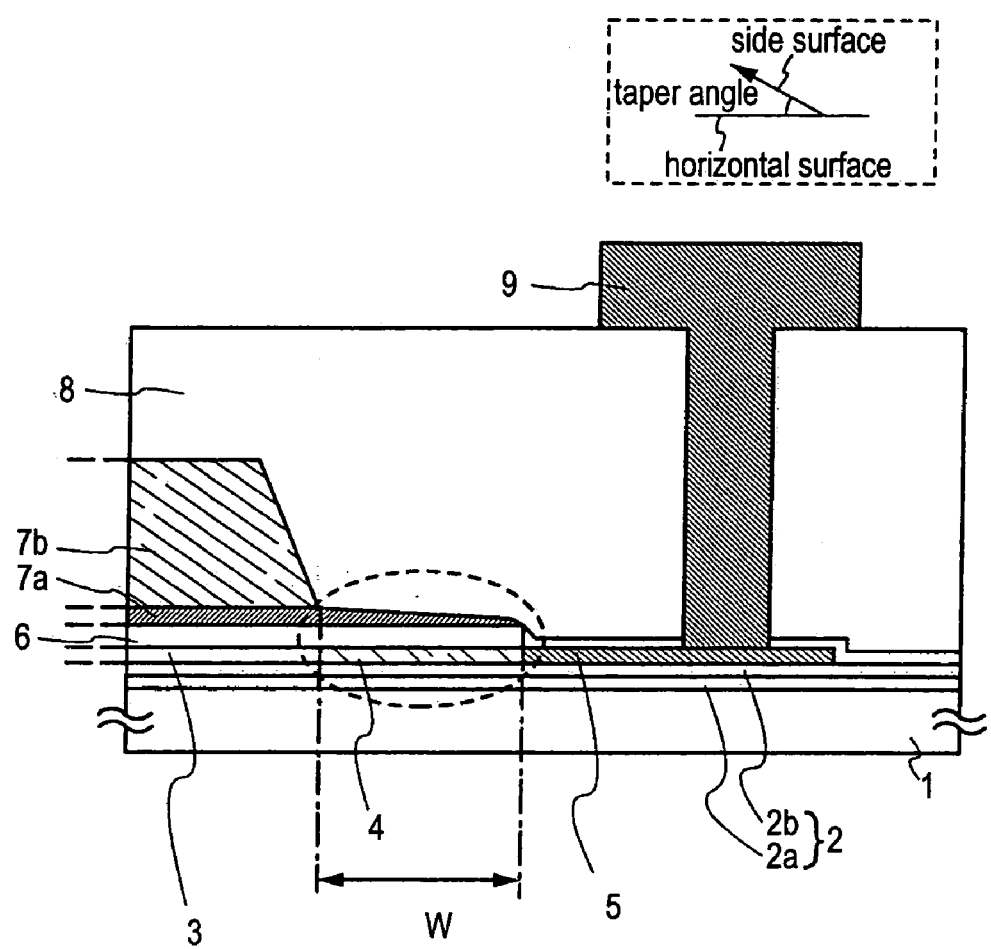
FIG. 1 shows a TFT structure according to the present invention.

Also, when the unevenness is caused on the surface of the LDD region in the TFT which has GOLD structure, the gate insulating film laminated thereon is influenced to form an unevenness and further, the gate electrode laminated thereon is influenced to form an unevenness. In particular, when a structure as shown in FIG. 1 is used, the gate electrode overlapped with the LDD region through the gate insulating film has a thickness of 60 nm or less and is extremely thin. Furthermore, doping is performed for the LDD region through the thin portion of the gate electrode. Thus, a concentration of an impurity in the LDD region becomes nonuniform by the influence of the unevenness of the thin portion of the gate electrode. In addition, a semiconductor layer has a thickness of about 50 nm, is very thin, and is ready to be influenced by an impurity concentration distribution in doping. In addition, with the shape of the gate electrode as shown in FIG. 1, a variation in etching performed in forming the gate electrode is directly reflected on the width of the LDD region, and a variation in TFT characteristics, particularly, variation in reliability is easily caused.

Therefore, according to the present invention, the surface of the LDD region is flattened. Specifically, a P-V value (peak to valley, a difference between a maximum value and a minimum value of a height) obtained by an AFM (atomic force microscope) is set to 50 nm or less, preferably, 30 nm or less. As a result, a TFT which has a superior GOLD structure can be obtained. In addition, according to the present invention, a margin in etching in forming the gate electrode can be increased.

(Embodiment Mode 1)

FIG. 1 is a schematic view showing a gate electrode and its vicinities of a TFT with a GOLD structure according to the present invention.

In FIG. 1, reference numeral 1 denotes a substrate, 2a and 2b denote base insulating films, 3 denotes a channel formation region, 4 denotes an LDD region, 5 denotes a drain region (or a source region), 6 denotes a gate insulating film, 7a denotes a first conductive layer, 7b denotes a second conductive layer, 8 denotes an interlayer insulating film, and 9 denotes a drain electrode (or a source electrode).

In a region surrounded by a dotted line in FIG. 1, the surface of the LDD region 4 is flattened. Thus, a reduction in off current value and improvement in reliability can be realized and an increase in parasitic capacitance due to the unevenness of the surface can be suppressed.

Also, when the surface of the LDD region 4 is flattened, the gate insulating film 6 is flattened in the region surrounded by the dotted line and the first conductive layer 7a is also flattened. In addition, the first conductive layer 7a has a thickness of 50 nm or less and is very thin, and doping is performed through the first conductive layer 7a to form the LDD region 4. Thus, flattening is very effective in suppressing a variation in impurity concentration in the LDD region 4.

Note that the first conductive layer 7a has a side surface with a taper angle in a region which is not overlapped with the second conductive layer 7b in a sectional view. The taper angle in this specification indicates an angle formed by a horizontal surface and a side surface of a material layer, as shown in the upper right diagram in FIG. 1. In addition, for the sake of convenience in this specification, the side surface with the taper angle is called a taper shape and a portion which has the taper shape is called a taper portion.

Therefore, the LDD region 4 has a concentration gradient in which a concentration of an impurity element for providing a conductivity type is increased as a distance from the channel formation region (distance in a channel length direction) is increased. The LDD region 4 which has such a concentration gradient is intentionally formed to eliminate a clear boundary and to relax an electric field concentration produced in the vicinity of a boundary portion, thereby TFT which has very low off current value and a high ratio of an on current value to an off current value is realized.

Hereinafter, an example, in which a TFT is manufactured utilizing the taper portion of a gate electrode by performing flattening processing to a surface of a semiconductor layer to flatten surfaces of regions to become LDD regions, is shown in FIGS. 2A to 2D and FIG. 3. The TFT has impurity regions (LDD regions) in which an impurity concentration (concentration of P) is continuously increased from the channel formation region side to the impurity region side.

First, a base insulating film 11 is formed on a substrate 10. As the substrate 10, a glass substrate, a quartz substrate, a silicon substrate, or a metallic substrate or a stainless substrate with an insulating film formed on the surface thereof may be used. In addition, a plastic substrate with a heat resistance, which is resistant to a processing temperature, may be used.

Also, an insulating film made from an insulating film such as a silicon oxide film, a silicon nitride film, or a silicon oxynitride film is formed as the base insulating film 11. Here, an example in which a two-layer structure (11a and 11b) is used for the base insulating film 11 is shown. However, a single layer film of the insulating film or a structure in which two layers or more are laminated may be used. Note that the base insulating film may not be formed.

Next, a semiconductor film which has an amorphous structure is formed on the base insulating film.

A semiconductor material containing mainly silicon is used for the semiconductor film which has the amorphous structure. Typically, an amorphous silicon film, an amorphous silicon germanium film, or the like is applied and formed to have a thickness of 10 nm to 100 nm by a plasma CVD method.

Next, the semiconductor film which has the amorphous structure is crystallized by using a crystallization technique described in JP 08-078329 A. According to the crystallization technique, a metallic element for promoting crystallization is selectively added to an amorphous silicon film, and heat treatment is performed to form the semiconductor film which has a crystalline structure expanding from an added region as a starting point. First, a nickel acetate solution, containing a metallic element (here, nickel) with catalysis for promoting crystallization at 1 ppm to 100 ppm in weight conversion, is applied onto the surface of the semiconductor film which has the amorphous structure by a spinner to form a nickel containing layer. A method for forming an extremely thin film such as a sputtering method, an evaporation method, or plasma processing may be used instead of the method of forming the nickel containing layer by the application. Although an example in which the solution is applied onto the entire surface is indicated here, the nickel containing layer may be selectively formed by forming a mask.

Next, heat treatment is performed for crystallization. In this case, silicide is formed in a portion of the semiconductor film which is in contact with the metallic element for promoting crystallization thereof and crystallization is progressed from the portion as a nucleus. Thus, the semiconductor film which has the crystalline structure is formed. Note that, it is desirable that a concentration of oxygen contained in the semiconductor film after the crystallization is $5 \times 10^{18}/\text{cm}^3$ or lower. Here, heat treatment for dehydrogenation (at 450° C. for 1 hour) is performed and then heat treatment for crystallization (at 550° C. to 650° C. for 4 hours to 24 hours) is performed. In addition, when crystallization is conducted by irradiating intense light, infrared light, visible light, ultraviolet light, or a combination thereof can be used. Typically, light emitted from a halogen lamp, a metal halide lamp, a xenon arc lamp, a carbon arc lamp, a high pressure sodium lamp, or a high pressure mercury lamp is used. A lamp light source is turned on for 1 second to 60 seconds, preferably, 30 seconds to 60 seconds. This operation is preferably repeated once to ten times so that the semiconductor film is instantaneously heated up to about 600° C. to 1000° C. Note that, if necessary, heat treatment for releasing hydrogen contained in the semiconductor film which has the amorphous structure may be performed before irradiating the intense light. In addition, the heat treatment and the irradiation of the intense light may be simultaneously performed for crystallization. When productivity is considered, it is desirable that the crystallization is conducted by irradiating the intense light.

The metallic element (here, nickel) is left in the thus obtained semiconductor film. Although the metallic element is not uniformly distributed in the semiconductor film, its average concentration is a concentration which exceeds $1 \times 10^{19}/\text{cm}^3$. Of course, even in such a state, various semiconductor elements including a TFT can be formed. The element is removed by a gettering method as described later.

After an oxide film formed during the heat treatment is removed, laser light (first laser light) is irradiated to the semiconductor film which has the crystalline structure in the atmosphere or an oxygen atmosphere in order to increase a crystallization ratio (ratio of a crystal component to a total volume of the film) and to repair a defect left in a crystal grain. In the case of irradiating the laser light (first laser light), an unevenness is formed on the surface of the semiconductor film and a thin oxide film is also formed on the surface thereof. As the laser light (first laser light), excimer laser light which has a wavelength of 400 nm or less, or the second harmonic or the third harmonic of a YAG laser is used.

Next, the oxide film formed in irradiating the first laser light is removed.

Next, laser light (second laser light) is irradiated to the semiconductor film which has the crystalline structure in a nitrogen atmosphere or a vacuum. In irradiating the laser light (second laser light), a ridge produced by irradiating the first light is reduced, that is, flattened. In addition, the present invention is not limited to the above flattening processing. For example, an etch back method of performing etching or the like for flattening after forming an applying film (typically a resist film), a chemical mechanical polishing method (CMP method), or the like can be also used. Note that the surface of the semiconductor film crystallized by adding nickel is further flattened as compared with the case of crystallization without adding nickel.

Next, an oxide film (called a chemical oxide) is formed by an aqueous solution containing ozone (typically, ozone water) to obtain a barrier layer made from the oxide film with a thickness of 1 nm to 10 nm. A semiconductor film containing a noble gas element is formed on the barrier layer.

According to another method of forming the barrier layer, irradiation of ultraviolet light is performed in an oxygen atmosphere to generate ozone, and the surface of the semiconductor film which has the crystalline structure may be oxidized to form the barrier layer. In addition, according to another method of forming the barrier layer, an oxide film with a thickness of about 1 nm to 10 nm may be deposited as the barrier layer by a plasma CVD method, a sputtering method, an evaporation method, or the like. In addition, according to another method of forming the barrier layer, heating with a clean oven may be performed up to about 200° C. to 350° C. to form a thin oxide film. Note that, the barrier layer is not particularly limited as long as any one of the above-mentioned methods or a combination thereof is performed. However, it is required that the barrier layer has a film quality or a film thickness so that nickel contained in the semiconductor film which has the crystalline structure can be moved to a semiconductor film containing a noble gas element by gettering performed later.

Here, the semiconductor film containing the noble gas element is formed by a sputtering method to produce a gettering cite. One kind or plural kinds of elements selected from the group consisting of helium (He), neon (Ne), argon (Ar), krypton (Kr), and xenon (Xe) are used as the noble gas element. In particular, argon (Ar) is low in cost and preferable. Here, the semiconductor film containing the noble gas element is formed using a target made of silicon in an atmosphere containing the noble gas element. There are two meanings for containing a noble gas element ion as an inert gas in the film. One is forming a dangling bond to produce a distortion in the semiconductor film. The other is producing a distortion between lattices of the semiconductor film. When an element such as argon (Ar), krypton (Kr), or xenon (Xe), which has a larger atomic radius than silicon, is used, a distortion between lattices of the semiconductor film is remarkably produced. In addition, when the noble gas element is contained in the film, not only a lattice distortion but also a dangling bond are produced to improve a gettering action.

Next, heat treatment is performed for gettering to reduce the concentration of the metallic element (nickel) or to remove the metallic element contained in the semiconductor film which has the crystalline structure.

Irradiation of intense light or heat treatment is preferably performed as the heat treatment for gettering. In gettering, the metallic element is moved in a direction from a substrate side to the surface of the semiconductor film containing the noble gas element. Thus, the metallic element contained in the semiconductor film which has the crystalline structure and is covered with the barrier layer is removed or the concentration thereof is reduced. It is preferable that a moving distance of the metallic element during gettering is at least a distance which is corresponding to the thickness of the semiconductor film which is the crystalline structure. Thus, gettering can be completed in a relatively short time. Here, sufficient gettering is conducted in the following manner; nickel is moved to the semiconductor film containing the noble gas element so as not to segregate in the semiconductor film which has the crystalline structure; and nickel is hardly contained in the semiconductor film which has the crystalline structure, that is, a concentration of nickel in the film is made to be $1\times10^{18}/cm^3$ or lower, desirably, $1\times10^{17}/cm^3$ or lower.

Next, only the semiconductor film containing the noble gas element is selectively removed using the barrier layer as an etching stopper. Then, the barrier layer is removed and the semiconductor film which has the crystalline structure is patterned by using a known patterning technique (first photo mask) to form a semiconductor layer 12 with a desired shape.

Next, an insulating film 13 covering the semiconductor layer 12 is formed.

The insulating film 13 is formed at a thickness of 40 nm to 150 nm by using a plasma CVD method or a sputtering method to be a single layer of an insulating film including silicon or a laminate structure thereof. Note that the insulating film 13 becomes a gate insulating film.

Figure 2A:
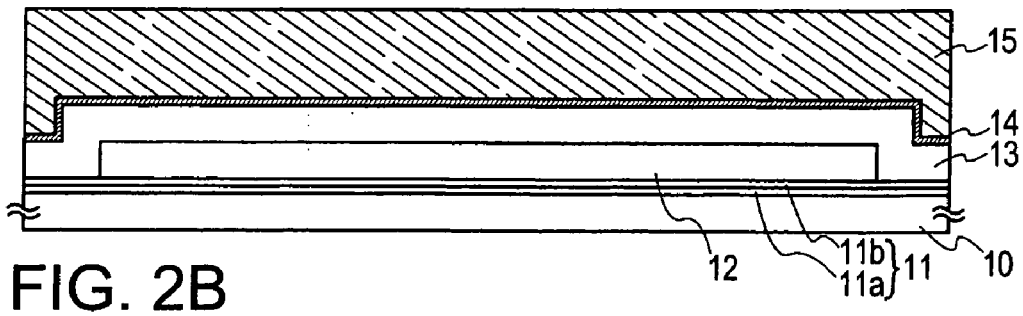
FIGS. 2A to 2D show steps of manufacturing a TFT.

Next, a first conductive film 14 with a film thickness of 20 to 100 nm and a second conductive film 15 with a film thickness of 100 to 500 nm are laminated on the insulating film 13 (FIG. 2A). Here, the first conductive film 14 made from a TaN film and the second conductive film 15 made from a W film are laminated by using a sputtering method. Note that TaN is used for the first conductive film 14 and W is used for the second conductive film 15 here. However, the present invention is not particularly limited to these materials, and an element selected from Ta, W, Ti, Mo, Al, and Cu, or an alloy material or a compound material which contains mainly the above-mentioned element may be used for forming the respective conductive films. In addition, a semiconductor film, which is represented by a polycrystalline silicon film doped with an impurity element such as phosphorus, may be used. In addition, the first conductive film 14 and the second conductive film 15 are used here. However, the present invention is not particularly limited to two layers, and a single layer or a laminate of three layers or more may be used.

Next, a resist mask is formed using a second photo mask and dry etching is performed under a first etching condition by using an ICP etching apparatus. The second conductive film 15 is etched under the first etching condition to obtain a second conductive layer which has a portion with a taper shape (taper portion) in the end portion.

Here, an angle of the taper portion (taper angle) is defined as an angle formed by the surface of the substrate (horizontal surface) and a slant portion of the taper portion. A taper angle of the second conductive layer can be set to a range of 5° to 45° by selecting an etching condition appropriately.

Figure 2B:
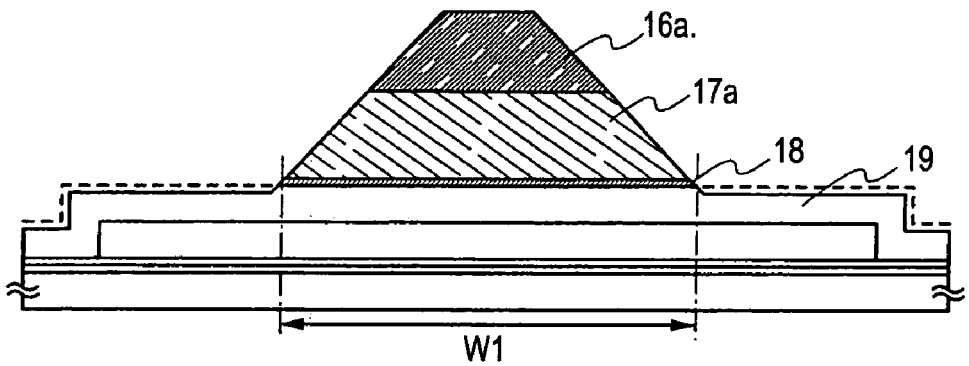

Next, the resist mask is used as it is and dry etching is performed under a second etching condition by using an ICP etching apparatus. The first conductive film 14 is etched under the second etching condition to form a first conductive layer 18 as shown in FIG. 2B. The first conductive layer 18 has a first width (W1). Note that the resist mask, the second conductive layer, and the insulating film are slightly etched under the second etching to form a resist mask 16a, a second conductive layer 17a, and an insulating film 19, respectively.

Note that, here, etching is performed under two etching conditions (first etching condition and second etching condition) in order to suppress a reduction in thickness of the insulating film 13. If an electrode structure (laminate of the second conductive layer 17a and the first conductive layer 18) as shown in FIG. 2B can be obtained, etching condition is not particularly limited and etching may be performed under a single etching condition.

Figure 2C:
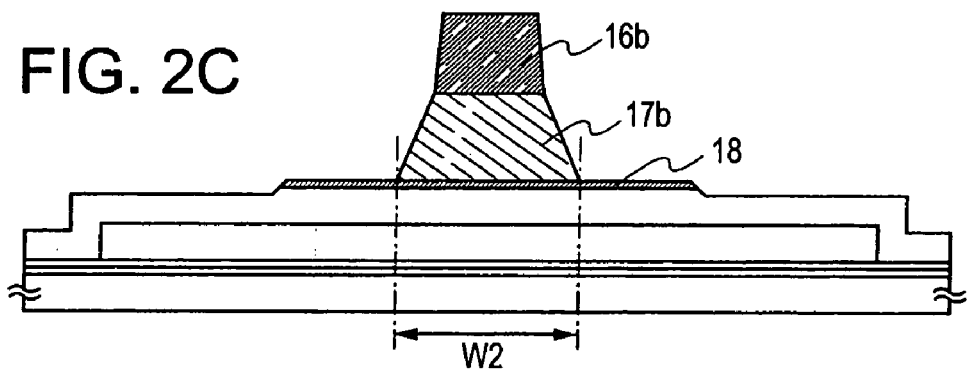

Next, with a state in which the resist mask 16a is left as it is, dry etching is performed under a third etching condition by using an ICP etching apparatus. The second conductive layer 17a is etched under the third etching condition to form a second conductive layer 17b as shown in FIG. 2C. The second conductive layer 17b has a second width (W2).

Figure 2D:
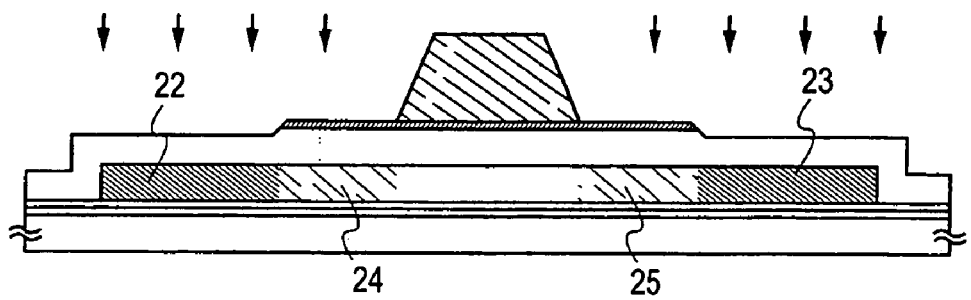
Figure 3:
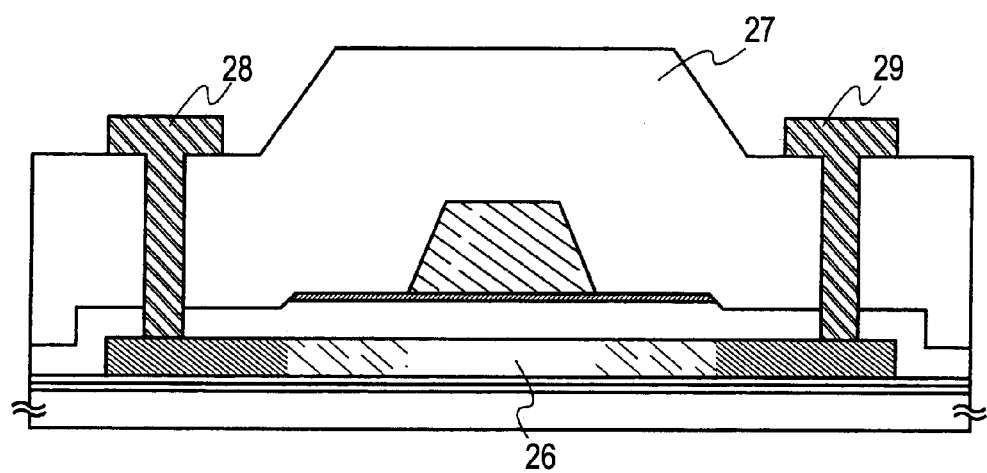
FIG. 3 shows a step of manufacturing the TFT.

Next, the resist mask 16b is removed and then a doping step is performed. In the doping step, through doping is performed through the insulating film 19 to form high concentration impurity regions 22 and 23 and simultaneously, through doping is performed through the taper portion of the first conductive layer 18 and the insulating film 19 to form low concentration impurity regions (which are also called LDD regions) 24 and 25 (FIG. 2D). An impurity is transmitted through the taper portion in the doping step to form the low concentration impurity regions 24 and 25 in which an impurity concentration (concentration of P) is continuously increased from the channel formation region side to the high concentration impurity region side. The surface of the semiconductor layer is flat. Thus, the surface of the first conductive layer which is in contact with the insulating film is also flat. Accordingly, the low concentration impurity regions can be formed without a variation. Note that, here, the high concentration impurity region and the low concentration impurity region are separately shown in the drawing. However, there is no clear boundary actually, therefore a region which has a concentration gradient is formed. In addition, similarly, there is no clear boundary between the channel formation region and the low concentration impurity region.

Thereafter, the impurity element added to the semiconductor layer is activated. The impurity element contained in the impurity regions is diffused by the activation. Thus, a concentration gradient with a smoother curve is produced so that no boundary is present between respective regions. Next, an interlayer insulating film 27 is formed, and then contact holes are formed using a third mask and electrodes 28 and 29 are formed using a fourth mask.

The TFT formed by the above-mentioned steps is characterized in that the surfaces of the low concentration impurity regions 24 and 25 are flat. Specifically, a P-V value of unevenness in the surfaces of the low concentration impurity regions 24 and 25 is set to 50 nm or less, preferably, 30 nm or less. In addition, Ra (center line average roughness) of the flattened surface of the semiconductor film can be set to 2 nm or less, and Rms (root mean square roughness) can be set to 2 nm or less. When the surfaces of the low concentration impurity regions 24 and 25 is made flat, a withstand voltage can be increased and reliability can be greatly improved. Note that the above numerical value indicating a degree of flatness (P-V value) is a value obtained in the case of measurement in an area range of 4 μm×4 μm, and Ra and Rms are values obtained in the case of measurement in an area range of 50 ìm×50 ìm.

Note that an experimental result is indicated in Table 1 in the case where nickel is added to a semiconductor film and heat treatment is performed for crystallization, and then surface roughness (P-V value, Ra, and Rms) of the semiconductor film obtained after first laser irradiation or after second laser irradiation is measured by an AFM.

[Table 1]

When the surfaces of the low concentration impurity regions 24 and 25 are flattened, reliability is greatly improved. Thus, even if a variation in shape of the gate electrode (typically, a shape of the taper portion of the first conductive layer) is caused for any reason, when the width W of the taper portion (shown in FIG. 1) is 0.50 ìm or more, sufficient reliability can be obtained. That is, according to the present invention, an etching margin in forming the gate electrode can be increased.

Also, the TFT formed by the above-mentioned steps is characterized in that each of the low concentration impurity regions 24 and 25, which is provided between a channel formation region 26 and the source region or between the channel formation region 26 and the drain region, has a concentration gradient in which an impurity concentration is continuously increased as a distance from the channel formation region is increased, and is overlapped with the gate electrode.

Also, the present invention is described here using the n-channel TFT. However, it is needless to say that a p-channel TFT can be formed by using a p-type impurity element instead of the n-type impurity element.

Also, the example of the top gate TFT is described here. However, the present invention can be applied regardless of a TFT structure. The present invention can be applied to, for example, a bottom gate (inverse staggered) TFT, or a staggered TFT.

Note that "an electrode" in this specification indicates a portion of "a wiring" and a portion electrically connected with another wiring or a portion intersecting with a semiconductor layer. Although "the wiring" and "the electrode" are separately used for the sake of convenience in description, it is assumed that the word "the electrode" always includes "the wiring".

(Embodiment Mode 2)

Hereinafter, an example to which the present invention is applied is described in the case of forming a plurality of different TFTs on the same substrate. Note that an example in which a first TFT including a first semiconductor layer as an active layer and a second TFT including a second semiconductor layer as the active layer are manufactured will be described here.

Figure 4A:
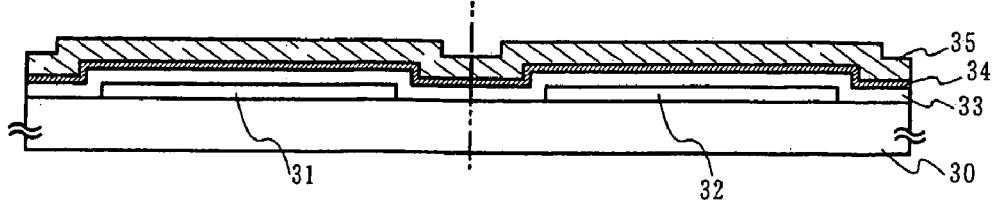
FIGS. 4A to 4E show steps of manufacturing a TFT (Embodiment Mode 2)

First, as in Embodiment Mode 1, semiconductor layers 31 and 32 each having a flat surface, an insulating film 33, a first conductive layer 34, and a second conductive layer 35 are formed on a substrate 30 (FIG. 4A).

Figure 4B:
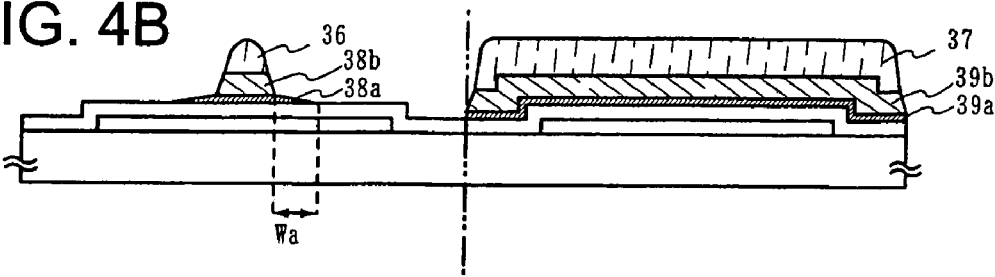

Next, as in the Embodiment Mode 1, etching is performed in the etching conditions 1 to 3 to form only a first gate electrode (38a and 38b) (FIG. 4B). Note that, in the first conductive layer 38a composing a lower layer of the first gate electrode, a portion with a width Wa shown in FIG. 4B becomes a taper portion and a remaining region is overlapped with the second conductive layer 38b. Here, a mask 37 made of a resist is formed in a region in which the second TFT is formed.

Figure 4C:
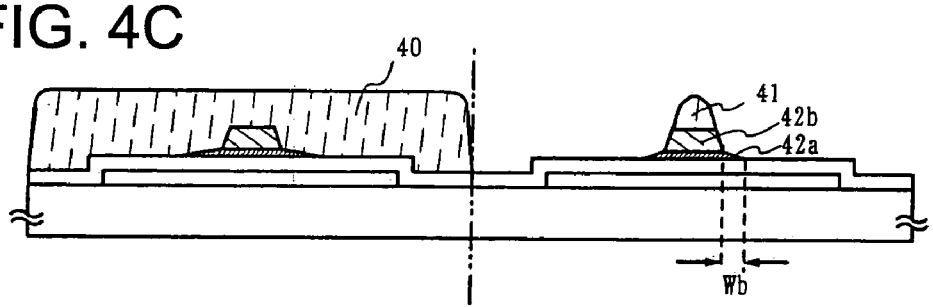

Next, the masks 36 and 37 made of a resist are removed and then a mask made of a resist is formed again. Then, a condition is changed appropriately so that a width Wb of a taper portion of a first conductive layer composing a lower layer of the second gate electrode is narrower than the width Wa and etching is performed under the etching conditions 1 to 3 to form only a second gate electrode (42a and 42b) (FIG. 4C). Note that, in the first conductive layer 42a composing the lower layer of the second gate electrode, a region with a width Wb shown in FIG. 4C becomes a taper portion and a remaining region is overlapped with the second conductive layer 42b. Here, a mask 40 made of a resist is formed in a region in which the first TFT is formed.

Figure 4D:
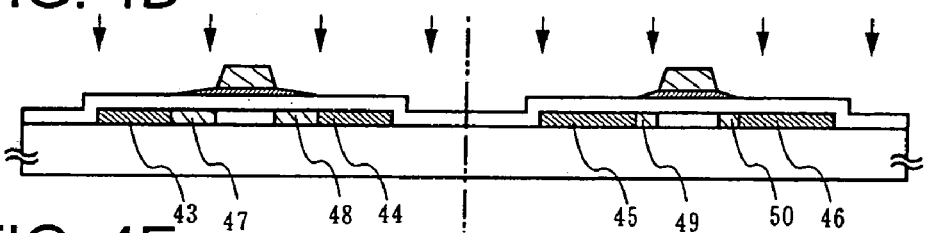

Next, the masks 40 and 41 made of a resist are removed and then doping for adding an impurity element to the semiconductor layers is performed. In the doping step, through doping is performed through the insulating film 33 to form high concentration impurity regions 43 to 46 and simultaneously, through doping is performed through the taper portions of the first conductive layers 38a and 42a and the insulating film 33 to form low concentration impurity regions (which are also called LDD regions) 47 to 50 (FIG. 4D).

Figure 4E:
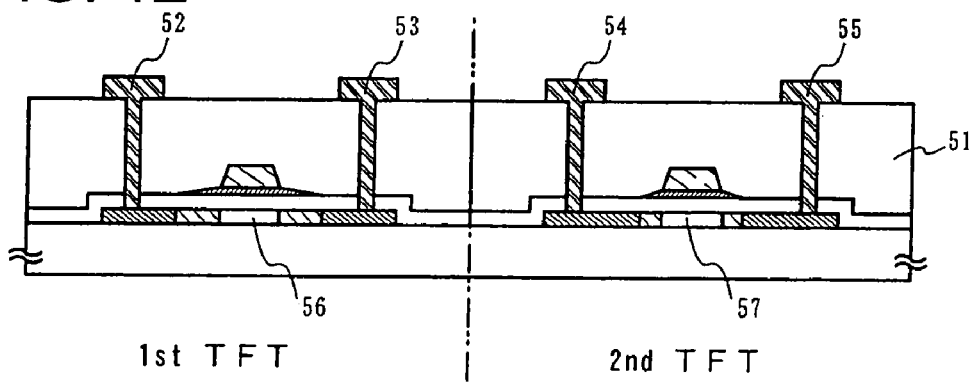

After that, the impurity element added to the semiconductor layers is activated. Next, an interlayer insulating film 51 is formed, and then contact holes are formed and electrodes 52 to 55 are formed (FIG. 4E).

Through the above-mentioned steps, the first TFT which has a channel formation region 56 and the second TFT which has a channel formation region 57 can be obtained on the same substrate.

In the above-mentioned steps, one more etching step is necessary as compared with Embodiment Mode 1. However, TFTs which have GOLD structures in which widths of LDD regions and the taper portions are different from each other can be separately formed on the same substrate. For example, the first TFT is preferably used as a TFT for a driver circuit in which an on current value and reliability are a high priority, and the second TFT is preferably used as a TFT for a pixel in which an off current value is a high priority. Note that, it is needless to say that any TFTs, that is, the first TFT and the second TFT have high reliability.

Note that, if the respective widths of the first conductive layers 38a and 42a that are overlapped with the low concentration impurity regions through the gate insulating film are in a range of 0.5 μm to 1.5 μm, sufficient reliability is obtained. Here, it is assumed that the width Wb<the width Wa.

Thus, even if the width of the first conductive layer 42a that is overlapped with the low concentration impurity regions through the gate insulating film is, for example, 0.5 μm, a TFT which has sufficient reliability can be obtained because the surfaces of the low concentration impurity regions are flat.

Also, the example in which the LDD regions are entirely overlapped with the gate electrode is shown in FIGS. 1 to 4A to 4E. However, even if a TFT structure in which a portion of the LDD regions is overlapped with the gate electrode is used, the present invention can be applied.

(Embodiment Mode 3)

Also, according to the present invention, when a storage capacitor is produced using a semiconductor layer as one electrode, the surface of the semiconductor layer is made flat, specifically, a P-V value obtained by an AFM is set to 50 nm or less. Thus, a leak current can be reduced and reliability can be improved. In addition, the present invention is effective when a TFT and a capacitor are formed on the same substrate, for example, when a pixel TFT and a storage capacitor using a semiconductor layer as one electrode are formed in a pixel portion. In this case, the surface of the semiconductor layer composing the storage capacitor and the surface of the LDD regions are made flat.

The present invention which has the above-mentioned structure will be described in more detail through the following embodiments.

[Embodiment 1]

Embodiments of the present invention will be described with reference to FIG. 5 through FIG. 7. Here, a method in which a pixel portion and TFT of a driver circuit provided on the periphery of the pixel portion (n-channel type TFT and p-channel type TFT) are prepared at the same time on the same substrate will be described in detail.

First, a base insulating film is formed on a substrate 100, a semiconductor film having a crystalline structure is formed, and then a semiconductor layers 102 to 106 isolated in an island shape are formed by etching processing in the desired shape.

A glass substrate (#1737) is used as a base film 100. As a base insulating film 101, a silicon oxynitride film 101a (composition ratio: Si=32%, O=27%, N=24% and H=17%) prepared from the raw material gases $SiH_4$, $NH_3$, and $N_2O$ was formed with a thickness of 50 nm (preferably, 10 to 200 nm) at 400° C. of the film formation temperature by a plasma CVD method. Subsequently, after the surface was washed by ozone water, the oxide film of the surface was removed by dilute hydrofluoric acid (1:100 dilution). Subsequently, a silicon oxynitride film 101b (composition ratio: Si=32%, O=59%, N=7% and H=2%) prepared from the raw material gases $SiH_4$ and $N_2O$ was lamination-formed with a thickness of 100 nm (preferably, 50 to 200 nm) at 400° C. of the film formation temperature by a plasma CVD method, and further, a semiconductor layer (here, an amorphous silicon film) having an amorphous structure was formed with a thickness of 54 nm (preferably, 25 to 80 nm) at 300° C. of the film formation temperature without the air release by a plasma CVD method.

In the present Embodiment, although the base film 101 is shown as a two-layer structure, a single layer film of the foregoing insulating film or a layer as a structure in which two layers or more are laminated may be formed. Moreover, there are no limitations to materials for a semiconductor film, but preferably, it may be formed using a silicon or a silicon germanium ($Si_xGe_{1-x}$(X=0.0001 to 0.02)) alloy or the like by the known methods (sputtering method, LPCVD method, plasma CVD method or the like). Moreover, a plasma CVD apparatus may be sheet type apparatus, or batch type apparatus. Moreover, the base insulating film and the semiconductor film may be continuously formed in the same film formation chamber without exposing to the air.

Subsequently, after the surface of the semiconductor film having an amorphous structure was washed, an oxide film having an extremely thin with a thickness of about 2 nm is formed on the surface with ozone water. Subsequently, in order to control the threshold value of TFT, a doping of a trace of impurity element (boron or phosphorus) is performed. Here, boron was added to the amorphous silicon film under the doping conditions of 15 kV of acceleration voltage, 30 sccm of flow rate of the gas in which diborane was diluted into 1% with hydrogen, $2 \times 10^{12}/cm^2$ of dosage without mass segregating diborane ($B_2H_6$) by utilizing an ion doping method in which plasma excitation was performed.

Subsequently, nickel acetate solution containing 10 ppm of nickel when it is converted to weight was coated by a spinner. A method of spreading over the entire surface with nickel element by a sputtering method instead of coating may be employed.

Subsequently, a semiconductor film having a crystalline structure was formed by performing the heat processing and crystallizing it. For this heat processing, the heat processing of an electric furnace or the irradiation of strong light may be used. In the case where it is performed by utilizing the heat processing of the electric furnace, it may be performed at 500° C. to 650° C. for 4 to 24 hours. Here, after the heat processing (500° C., one hour) for dehydrogenation was carried out, a silicon film having a crystalline structure was obtained by performing the heat processing for crystallization (550° C., 4 hours). It should be noted that although here, crystallization was performed using the heat processing by the furnace, however, the crystallization may be performed by a lamp anneal apparatus. It should be noted that here, a crystallization technology using nickel as a metal element for promoting the crystallization of silicon is used. However, the other known crystallization technology, for example, solid-phase growth method or laser crystallization method may be used.

Subsequently, after the oxide film of the surface of the silicon film having a crystalline structure was removed by dilute hydrofluoric acid or the like, the irradiation of the first laser light (XeCl: wavelength 308 nm) for enhancing the crystallization ratio and repairing the defaults remained within the crystal grain is performed in the air, or in the oxygen atmosphere. For the laser light, an excimer laser light with 400 nm or less of wavelength, or the second higher harmonic wave or the third higher harmonic wave of YAG laser is used. Anyhow, using pulse laser light having about 10 to 1000 Hz of repeated frequency, the laser light is condensed at 100 to 500 mJ/cm$^2$ by an optical system, irradiated with overlap ratio of 90 to 95% and may scanned on the surface of the silicon film. Here, the irradiation of the first laser light is performed at repeated frequency of 30 Hz, 393 mJ/cm$^2$ of energy density in the air. It should be noted that since the irradiation of the first laser light is performed in the air, or in the oxygen atmosphere, an oxide film is formed on the.

Subsequently, after the oxide film formed by irradiation of the first laser light was removed by dilute hydrofluoric acid, the irradiation of the second laser light is performed in the nitrogen atmosphere or in the vacuum, thereby to flatten the surface of the semiconductor film. For this laser light (second laser beam), an excimer laser light having a wavelength of 400 nm or less, or the second higher harmonic wave or the third higher harmonic wave of YAG laser is used. The energy density of the second laser light is made larger than the energy density of the first laser light, preferably, made larger by 30 to 60 mJ/cm$^2$. Here, the irradiation of the second laser light is performed at 30 Hz of the repeated frequency and 453 mJ/cm$^2$ of energy density, P-V value of the unevenness in the surface of the semiconductor film is to be 50 nm or less.

Moreover, in this embodiment, the irradiation of the second light beam was performed on the entire surface. However, since the reduction of the OFF-state current is particularly effective to the TFT of the pixel portion, the second laser light may be selectively irradiated to at least pixel portion.

Subsequently, a barrier layer consisted of an oxide film of total 1 to 5 nm in thickness is formed by processing the surface with ozone water for 120 seconds.

Subsequently, an amorphous silicon film containing argon element which is to be gettering site is formed in film thickness of 150 nm on the barrier layer by a sputtering method. The film formation conditions by a sputtering method of the present Embodiment are made as 0.3 Pa of film formation pressure, 50 (sccm) of gas (Ar) volumetric flow rate, 3 kW of film formation power, and 150° C. of the substrate temperature. It should be noted that the atomic percentage of argon element contained in the amorphous silicon film under the above-described conditions is in the range from $3\times10^{20}$/cm$^3$ to $6\times10^{20}$/cm$^3$, the atomic percentage of oxygen is in the range from $1\times10^{19}$/cm$^3$ to $3\times10^{19}$/cm$^3$. Then, the gettering is performed by carrying out the heat processing at 650° C. for 3 minutes using a lamp anneal apparatus.

Subsequently, after the barrier layer is made an etching stopper, the amorphous silicon film containing argon element which is the gettering site was selectively removed, the barrier layer is selectively removed with dilute hydrofluoric acid. It should be noted that since when gettering, nickel tends to easily move into the higher oxygen density region, it is desirable that the barrier layer consisted of an oxide film is removed after the gettering.

Subsequently, after a thin oxide film is formed with the ozone water on the surface of the silicon film (also referred to as "polysilicon film") having the obtained crystalline structure, a mask made of a resist is formed, and the semiconductor layers 102 to 106 isolated in an island shape is formed in the desired shape by etching processing. After the semiconductor layer was formed, the mask made of the resist is removed.

Subsequently, the oxide film was removed by an etchant containing hydrofluoric acid, and at the same time, the surface of the silicon film was washed, an insulating film whose principal component is silicon and which is to be a gate insulating film 107 is formed. In the present Embodiment, a silicon oxynitride film (composition ratio Si=32%, O=59%, N=7% and H=2%) is formed in thickness of 115 nm by plasma CVD method.

Figures 5A, 5B, 5C, 5D:
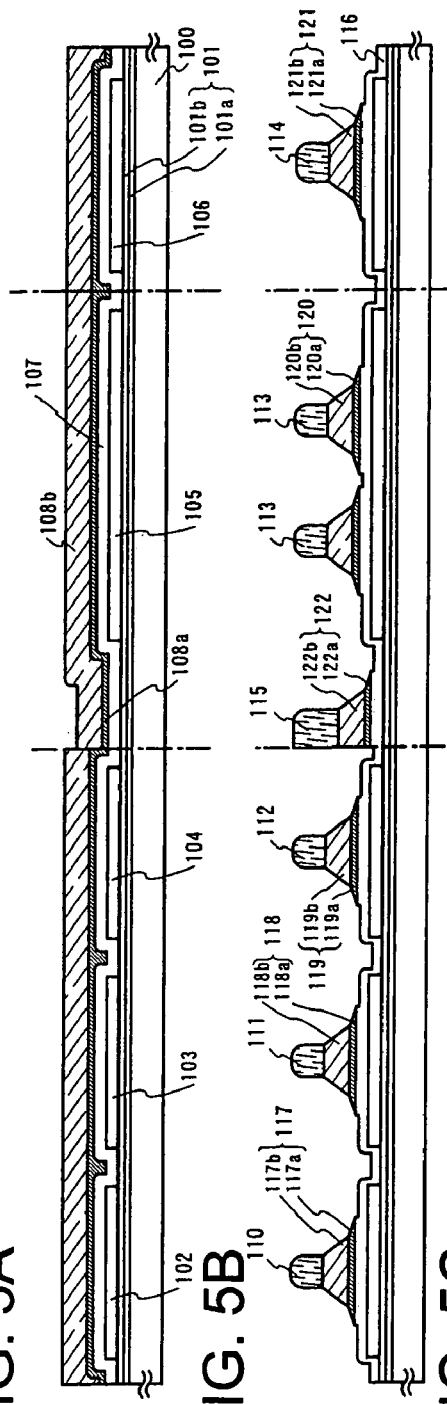
FIGS. 5A to 5D show steps of manufacturing an active matrix substrate.

Subsequently, as shown in FIG. 5A, the first conductive film 108a having film thickness of 20 to 100 nm and the second conductive film 108b having film thickness of 100 to 500 nm are lamination-formed on the gate insulating film 107. In the present Embodiment, a tantalum nitride film having film thickness of 50 nm and a tungsten film having film thickness of 370 nm are in turn laminated on the gate insulating film 107.

As a conductive material for forming the first conductive film and the second conductive film, it is formed using an element selected from Ta, W, Ti, Mo, Al and Cu, or alloy material or compound material whose principal component is the foregoing element. Moreover, as the first conductive film and the second conductive film, a semiconductor film represented by a poly crystal silicon film in which impurity element such as phosphorus or the like is doped, and Ag, Pd, Cu alloys may be used. Moreover, it is not limited to a two-layer structure. For example, it may be made a three-layer structure in which a tungsten film having film thickness of 50 nm, aluminum-silicon (Al—Si) alloy film having film thickness of 500 nm, and a titanium nitride film having film thickness of 30 nm are in turn laminated. Moreover, in the case of a three-layer structure, instead of tungsten of the first conductive film, tungsten nitride may be used, instead of aluminum-silicon (Al—Si) alloy film of the second conductive film, aluminum-titanium (Al—Ti) alloy film may be used, or instead of a titanium nitride film of the third conductive film, a titanium film may be used. Moreover, it may be a single layer structure.

Next, as shown in FIG. 5B, masks 110 to 115 made of resists are formed by light exposure step, the first etching processing for forming a gate electrode and wirings is performed. The first etching processing is performed under the first and second etching conditions. As for an etching, ICP (Inductively Coupled Plasma) etching method may be used. The film can be etched in the desired tapered shape by appropriately adjusting the etching conditions (electric energy applied to the coil type electrode, electric energy applied to the electrode on the substrate side, temperature of electrode on the substrate side and the like). It should be noted that as gas for an etching, chlorine based gas which is represented by $Cl_2$, $BCl_3$, $SiCl_4$, $CCl_4$ or the like, fluorine based gas which is represented by $CF_4$, $SF_6$, $NF_3$ or the like or $O_2$ can be appropriately used.

In the present Embodiment, 150 W of RF (13.56 MHz) electric power is also supplied to the substrate side (sample stage), and substantially negative self-bias voltage is applied. The end section of the first conductive layer is made in a tapered shape by etching W film under the first etching conditions. The etching rate to W under the first etching conditions is 200.39 nm/min, the etching rate to TaN is 80.32 nm/min, and the selection ratio of W to TaN is about 2.5. Moreover, the tapered angle of W is about 26°. Then, the first etching condition was changed to the second etching condition without removing the masks 110 to 115 made of resists, $CF_4$ and $Cl_2$ were used for etching gas, the respective ratio of gas volumetric flow rate was made 30/30 (sccm), 500 W of RF (13.56 MHz) electric power was supplied to the coil type electrode at 1 Pa of the pressure, the plasma was generated and the etching was performed for about 30 seconds. 20 W of RF (13.56 MHz) electric power was also supplied to the substrate side (sample stage), and substantially negative self-bias voltage was applied. The W film and TaN film were etched at the same degree under the second etching condition wherein $CF_4$ and $Cl_2$ were mixed. The etching rate to W under the second etching conditions was 58.97 nm/min, and the etching rate to TaN was 66.43 nm/min. It should be noted that in order to etch without remaining residue on the gate insulating film, it might increase the etching time at the ratio of about 10 to 20%.

In the above-described first etching processing, the end section of the first conductive layer and the second conductive layer becomes in a tapered shape due to the effect of the bias voltage to be applied to the substrate side by making the mask made of resist adjust to be suitable. The angle of this tapered section may be made in the range from 15° to 45°.

In this way, conductive layers 117 to 121 in the first shape consisted of the first conductive layer and the second conductive layer (first conductive layers 117a to 121a and the second conductive layers 117b to 121b) are formed by the first etching processing. The insulating film 107 which is to be a gate insulating film is etched about 10 to 20 nm, becomes a gate insulating film 116 whose region not covered with the conductive layers 117 to 121 in the first shape is made thinner.

Subsequently, the second etching processing is performed without removing the mask made of the resist. Here, using $SF_6$, $Cl_2$ and $O_2$ for etching gas, the etching was performed for 25 seconds by making the ratio of gas volumetric flow rate 24/12/24 (sccm), supplying 700 W of RF (13.56 MHz) electric power to the coil type electrode and generating the plasma at 1.3 Pa of the pressure. 10 W of RF (13.56 MHz) electric power was also supplied to the substrate side (sample stage), and substantially a negative self-bias voltage was applied. The etching rate to W under the second etching conditions was 227.3 nm/min, and the etching rate to TaN was 32.1 nm/min, the selection ratio of W to TaN is 7.1, the etching rate to SiON which is an insulating film 116 is 33.7 nm/min, and the selection ratio of W to SiON is 6.83. In this way, in the case where $SF_6$ is used for etching gas, since the selection ratio to the insulating film 116 is high, the film reduction can be suppressed. In the present Embodiment, in the insulating film 116, only about 8 nm of the film reduction occurred.

The tapered angle became 70° by the second etching processing. The second conductive layers 124b to 129b are formed by the second etching processing. On the other hand, the first conductive layer is scarcely etched, and becomes the first conductive layers 124a to 129a. It should be noted that the sizes of the first conductive layers 124a to 129a are almost the same with the first conductive layers 117a to 122a. Actually, although there are some cases where the width of the first conductive layer is backward by about 0.3 µm comparing to that before the second etching, that is, about 0.6 µm in whole line width backward, there is scarcely no change in size.

Moreover, in the case where instead of two-layer structure, three-structure in which a tungsten film having film thickness of 50 nm, an aluminum-silicon (Al—Si) alloy film having film thickness of 500 nm, and a titanium nitride film having film thickness of 30 nm are in turn laminated is employed, as for the first etching conditions of the first etching processing, the etching may be performed for 117 seconds by utilizing $BCl_3$, $Cl_2$ and $O_2$ as raw material gases, making the respective ratio of gas volumetric flow rates 65/10/5 (sccm), supplying 300 W of RF (13.56 MHz) electric power to the substrate side (sample stage), supplying 450 W of RF (13.56 MHz) electric power to the coil type electrode at 1.2 Pa of the pressure and generating plasma. As for the second etching conditions of the first etching processing, the etching may be performed for about 30 seconds by utilizing $CF_4$, $Cl_2$ and $O_2$ as raw material gases, making the respective ratio of gas volumetric flow rates 25/25/10 (sccm), supplying 20 W of RF (13.56 MHz) electric power to the substrate side (sample stage), supplying 500 W of RF (13.56 MHz) electric power to the coil type electrode at 1 Pa of the pressure and generating a plasma. As for the second etching processing, the etching may be performed by utilizing $BCl_3$ and $Cl_2$ as raw material gases, making the respective ratio of gas volumetric flow rates 20/60 (sccm), supplying 100 W of RF (13.56 MHz) electric power to the substrate side (sample stage), supplying 600 W of RF (13.56 MHz) electric power to the coil type electrode at 1.2 Pa of the pressure and generating a plasma.

Subsequently, after the mask made of the resist was removed, the state of FIG. 5D is obtained by performing the first doping processing. The doping processing may be carried out by an ion doping method, or ion implantation method. The conditions of an ion doping method are $1.5 \times 10^{14}$ atoms/cm$^2$ of dosage, and 60 to 100 keV of the accelerating voltage, it is performed under these conditions. As an impurity element imparting n-type, typically, phosphorus (P) or arsenic (As) are used. In this case, the first conductive layers and the second conductive layers 124 to 128 are masks with respect to the impurity element imparting n-type, first impurity regions 130 to 134 are formed in a self-aligned manner. The impurity elements imparting n-type are added in the density range from $1 \times 10^{16}$ to $1 \times 10^{17}$/cm$^3$ to the first impurity regions 130 to 134. Here, the region having the same density range as the first impurity region is also referred to as n$^-$ region.

It should be noted that in this embodiment, after the mask made of resist was removed, the first doping processing was performed. However, the first doping processing may be performed without removing the mask made of the resist.

Subsequently, as shown in FIG. 6A, the masks 135 to 137 made of resists are formed and the second doping processing is performed. The mask 135 is a mask for protecting the channel forming region of the semiconductor layer forming p-channel type TFT of the driver circuit and its peripheral region, the mask 136 is a mask for protecting the channel forming region of the semiconductor layer forming one of n-channel type TFT of the driver circuit and its peripheral region, and the mask 137 is a mask for protecting the channel forming region of the semiconductor layer forming TFT of the pixel portion and its peripheral region, and further a region which is to be storage capacitor.

The conditions for ion doping in the second doping processing are $1.5 \times 10^{15}$ atoms/cm$^2$ of dosage, and 60 to 100 keV of the acceleration voltage, and under these conditions, phosphorus (P) is doped. Here, by utilizing the second conductive layers 124b to 126b as masks, the impurity region is formed in a self-aligned manner on the respective semiconductor layers. Needless to say, to the region covered with the masks 135 to 137, the impurities are not added. Thus, second impurity regions 138 to 140 and third impurity region 142 are formed. The impurity element imparting n-type is added in the density range from $1 \times 10^{20}$ to $1 \times 10^{21}$/cm$^3$ on the second impurity regions 138 to 140. Here, the region having the same density range as the second impurity region is also referred to as n$^+$ region.

Moreover, the third impurity region is formed to have a lower density than that of the second impurity region by the first conductive layer, and the impurity element imparting n-type is added in the density range from $1 \times 10^{18}$ to $1 \times 10^{19}$/cm$^3$. It should be noted that since the doping is performed through the portion of the first conductive layer, the third impurity region has a density gradient in which the impurity density increases toward the end portion of the tapered portion. Here, the region having the same density range as the third impurity region is also referred to as n$^-$region. Moreover, the impurity element is not added to the region covered by the masks 136 and 137 in the second doping processing, therefore, these become the first impurity regions 144 and 145.

Subsequently, after the masks 135 to 137 made of the resists were removed, the masks 146 to 148 made of resists are newly formed, and as shown in FIG. 6B, the third doping processing is performed.

In the driver circuit, the fourth impurity regions 149 and 150 and the fifth impurity regions 151 and 152 in which the impurity element imparting p-type conductivity to the semiconductor layer for forming p-channel type TFT and the semiconductor layer for forming storage capacitor has been added are formed by the above-described third doping processing.

Moreover, it is made so that the impurity element imparting p-type is added to the fourth impurity regions 149 and 150 in the range from $1 \times 10^{20}$ to $1 \times 10^{21}$/cm$^3$. It should be noted that the fourth impurity regions 149 and 150 are the regions (n$^-$ region) to which phosphorus (P) has been added in the prior step. However, the forth impurity regions 149 and 150 are doped with an impurity element imparting p-type conductivity in a concentration 1.5 to 3 times higher than the phosphorus concentration and therefore has the has the p-type conductivity. Here, the region having the same density range as the fourth impurity region is also referred to as p$^+$ region.

Moreover, the fifth impurity regions 151 and 152 are formed in the region overlapped with the tapered portion of the second conductive layer 125a, it is made so that the impurity element imparting p-type is added in the density range from $1 \times 10^{18}$ to $1 \times 10^{20}$/cm$^3$. Here, the region having the same density range with the fifth impurity region is also referred to as p$^{31}$ region.

Up to the above-described steps, the impurity regions having n-type or p-type conductivity are formed on the respective semiconductor layers. The conductive layers 124 to 127 become gate electrodes of TFT. Moreover, the conductive layer 128 becomes one of the electrodes for forming the storage capacitor in the pixel portion. Furthermore, the conductive layer 129 forms source wirings in the pixel portion.

Subsequently, an insulating film (not shown) for covering the nearly whole surface is formed. In the present Embodiment, a silicon oxide film having film thickness of 50 nm has been formed by plasma CVD method. Needless to say, this insulating film is not limited to the silicon oxide film, another insulating film containing silicon may be used as a single layer or a lamination structure.

Subsequently, the step for processing the activation of the impurity elements added to the respective semiconductor layers is carried out. This activation step is performed by rapid thermal annealing method (RTA method) using a lamp light source, or a method of irradiating YAG laser or excimer laser from the back side, or heat processing using a furnace, or a method combined with any method of these methods.

Moreover, in the present Embodiment, although an example in which an insulating film was formed before the above-described activation has been shown, the step may be made a step in which after the above-described activation was performed, the insulating film is formed.

Subsequently, the first interlayer insulating film 153 consisted of a silicon nitride film is formed, the heat processing (heat processing at 300 to 550° C. for 1 to 12 hours) is performed, and the step in which a semiconductor layer is hydrogenated (FIG. 6C). This step is a step in which the dangling bond of the semiconductor layer is terminated by hydrogen contained in first interlayer insulating film 153. The semiconductor layer can be hydrogenated regardless of the existence of the insulating film (not shown) consisted of a silicon oxide film. However, since in the present Embodiment, the materials whose principal component is aluminum are used for the second conductive layer, it is important that the heat processing conditions are made so that the second conductive layer is endurable in the step of hydrogenation. As the other means for hydrogenation, plasma hydrogenation (hydrogen excited by plasma is used) may be performed.

Subsequently, the second interlayer insulating film 154 consisted of organic insulating material is formed on the first interlayer insulating film 153. In the present Embodiment, an acryl resin film having film thickness of 1.6 μm is formed. Subsequently, a contact hole reaching the source wiring 129, a contact hole reaching the conductive layers 127 and 128 and a contact hole reaching the respective impurity regions are formed. In the present Embodiment, several etching processes are in turn performed. In this embodiment, after the second interlayer insulating film was etched by utilizing the first interlayer insulating film as an etching stopper, the insulating film (not shown) was etched following the first interlayer insulating film was etched by utilizing the insulating film (not shown).

Then, the wirings and pixel electrodes are formed using Al, Ti, Mo, W and the like. It is preferable that, as for these materials for electrode and pixel electrode, a film whose principal component is Al or Ag, or a material excellent in reflecting properties such as a lamination of these or the like is used. Thus, source electrodes or drain electrodes 155 to 160, a gate wiring 162, a connecting wiring 161, and a pixel electrode 163 are formed.

Figure 7:
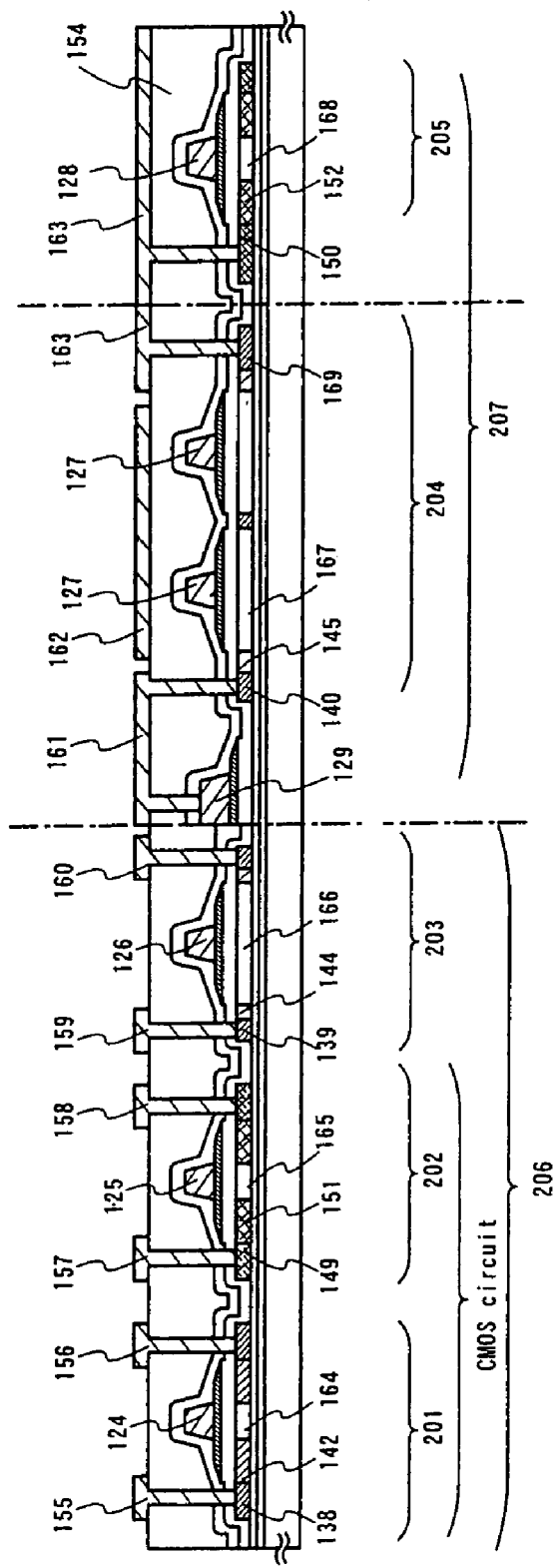
FIG. 7 shows a step of manufacturing the active matrix substrate.

As described above, a driver circuit 206 having a n-channel type TFT 201, a p-channel type TFT 202 and a n-channel type TFT 203, and a pixel portion 207 having a pixel TFT 204 consisted of a n-channel type TFT and a storage capacitor 205 can be formed on the same substrate (FIG. 7). In the present specification, such a substrate is referred to as active matrix substrate for the sake of convenience.

Figure 8:
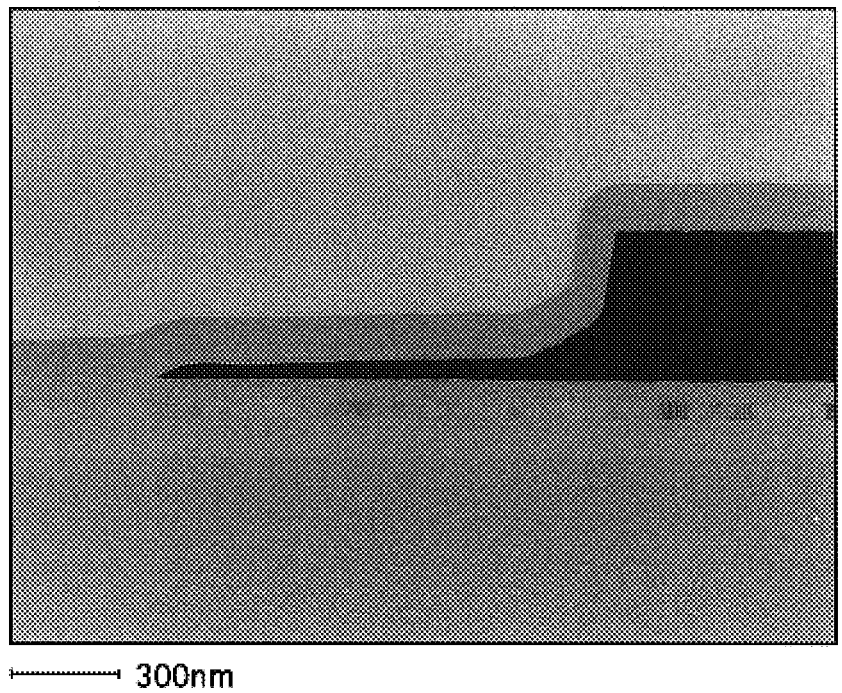
FIG. 8 is a TEM photograph obtained by observing the vicinity of a gate electrode.
Figure 21:
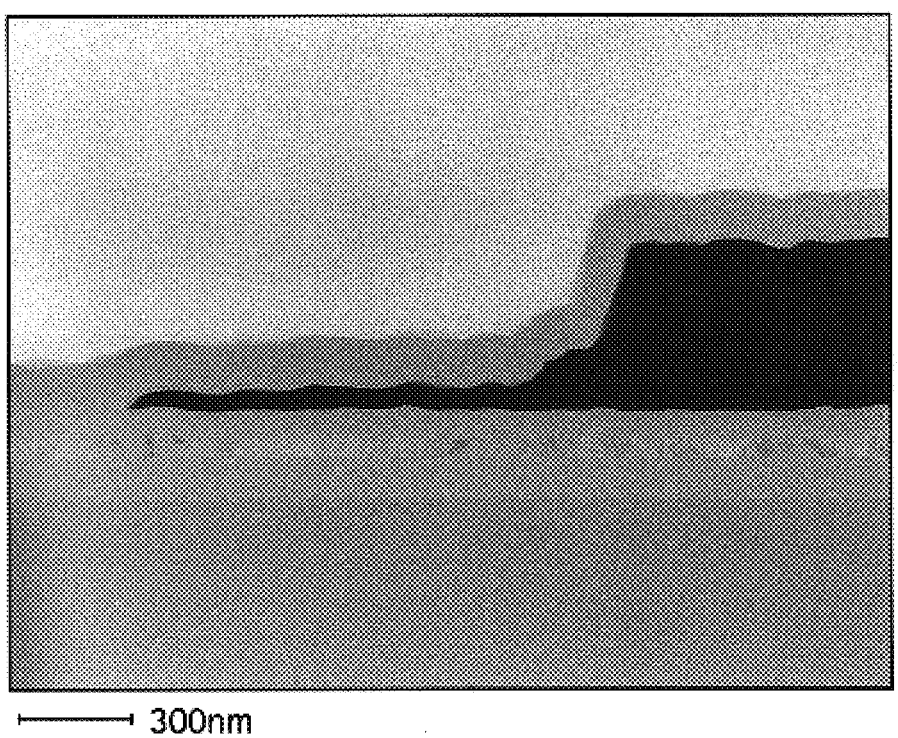
FIG. 21 is a TEM photograph obtained by observing the vicinity of a gate electrode (comparative example).

Further, FIG. 8 shows a photograph of a section of a vicinity of the gate electrode in observation with TEM. As shown in FIG. 8, the surface of the semiconductor film (including a surface of a LDD region) is flattened due to the second laser beam. Since the LDD region is flat, the influence of unevenness in the surface of the LDD region is hardly seen in the gate insulating film on the semiconductor film or in the tapered portion of the gate electrode. Further, a photograph of a section of a vicinity of the gate electrode of TFT to which leveling is not conducted, in observation with TEM, is shown in FIG. 21 as a comparison example.

In the pixel portion 207, the pixel TFT 204 (n-channel type TFT) has a channel forming region 167, the first impurity region (n⁻ region) 145 formed outside the gate electrode 127, and the second impurity region (n⁺ region) 140 functioning as a source region. A forth impurity region 150 and a fifth impurity region 152 are formed in the semiconductor layer functioning as one of the electrodes of the storage capacitor 205. It should be noted that the surface of the semiconductor layer functioning as one of the electrodes of the storage capacitor 205 is leveled. Specifically, by setting a P-V value obtained by AFM to 50 nm or less, reduction of the leak current and improvement of reliability can be realized. The storage capacitor 205 is constituted of the second electrode 128 and the semiconductor layers 150, 152, and 168 with the insulating film (the same film as the gate insulating film) 116 as dielectric.

Moreover, in the driver circuit 206, the n-channel type TFT 201 (first n-channel type TFT) has a channel forming region 164, the third impurity region (n⁻ region) 142 overlapped with a portion of the gate electrode 124 via an insulating film, and the second impurity region (n⁺ region) 138 functioning as a source region or drain region.

Moreover, in the driver circuit 206, the p-channel type TFT 202 has a channel forming region 165, the fifth impurity region (p⁻ region) 151 overlapped with a portion of the gate electrode 125 via an insulating film, and the fourth impurity region (p⁺ region) 149 functioning as a source region or drain region.

Moreover, in the driver circuit 206, the n-channel type TFT 203 (second n-channel type TFT) has a channel forming region 166, the first impurity region (n⁻ region) 144 outside of the gate electrode 126, and the second impurity region (n⁺ region) 139 functioning as a source region or drain region.

A shift register circuit, a buffer circuit, a level shifter circuit, a latch circuit and the like are formed by appropriately combining these TFTs 201 to 203, and the driver circuit 206 may be formed. For example, a CMOS circuit may be formed by complementarily connecting the n-channel type TFT 201 and the p-channel type TFT 202.

Particularly, for a buffer circuit whose driver voltage is high, the structure of the n-channel type TFT 203 is suitable for the purpose of preventing the deterioration due to the hot carrier effect of a LDD structure.

Moreover, for a circuit in which the reliability is considered as the top priority, the structure of the n-channel type TFT 201 which is a GOLD structure is suitable.

Furthermore, the electrical characteristics of the n-channel type TFT 201, which is obtained in accordance with this embodiment, were measured, and the reliability was inspected. Here, fluctuation of an on-current value (also referred to as deterioration rate), which is the index of the reliability, is obtained. Note that the on-current value is obtained by the measurement with a drain voltage Vd=1 V and a gate voltage Vg=10 V.

Figure 9A:
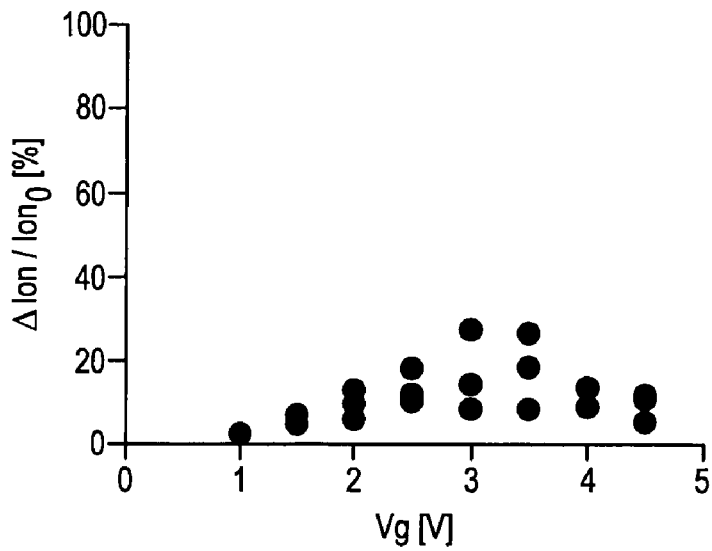
FIGS. 9A and 9B are graphs showing deterioration factors in TFTs (in which the film thickness of a gate insulating film is 115 nm)

First, in order to find characteristic variation of the n-channel type TFT 201 due to a transient stress, after the on-current value before applying the transient stress ($Ion_0$) is measured, the transient stress is applied at a room temperature for 100 seconds under the condition of the drain voltage Vd=+25 V and the gate voltage Vg=1 V, 1.5 V, 2 V, 2.5 V, 3 V, 3.5 V, 4 V, or 4.5 V. Thereafter, the on-current value is measured again, and the on characteristic fluctuation before and after applying the transient stress ($Ion/Ion_0$) is shown in FIGS. 9A (comparison example) and 9B (this embodiment). The transient stress indicates a stress in setting a drain voltage of a TFT to a certain value and fixing a gate voltage for a certain period of time. Note that the size of the channel forming region of the TFT is set to channel length L/channel width W=10 μm/8 μm, and the width in the channel length direction is 1.1 μm in the third impurity region 142 that overlaps the gate electrode through the gate insulating film (film thickness of 115 nm) in the TFT used for the measurement.

In the comparison example (FIG. 9A), the TFT manufactured without performing the second laser irradiation is used. Only the first laser irradiation is performed to the TFT for the comparison example.

Figure 9B:
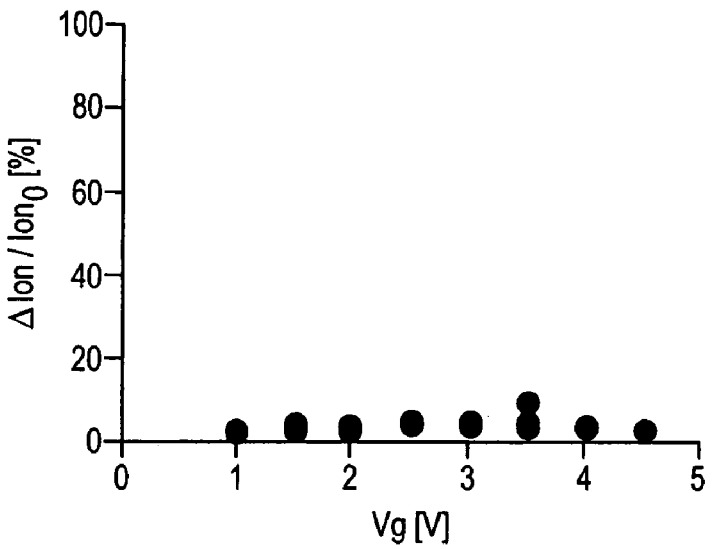

The fluctuation of the on-current value (deterioration rate) is smaller in this embodiment (FIG. 9B) in comparison with the comparison example (FIG. 9A). Thus, it is shown that the reliability of the TFT is higher in the case where the second laser irradiation is conducted to flatten the surface of the semiconductor film (including the LDD region).

Figure 10A:
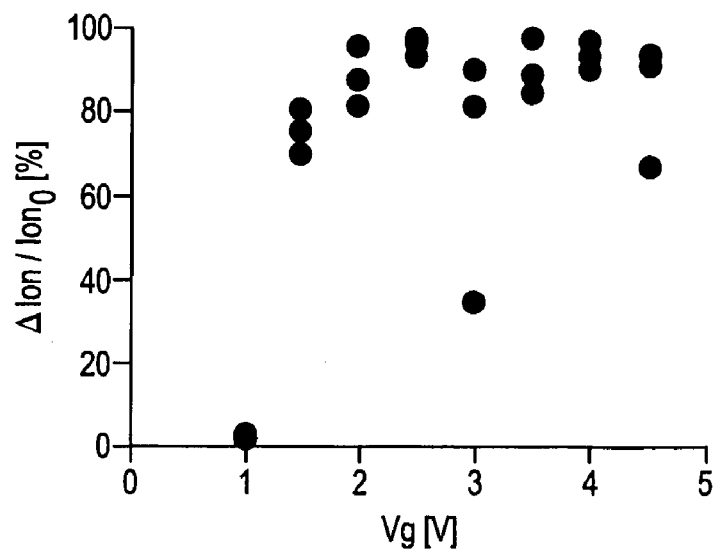
FIGS. 10A and 10B are graphs showing deterioration factors in TFTs (in which the film thickness of the gate insulating film is 80 nm)
Figure 10B:
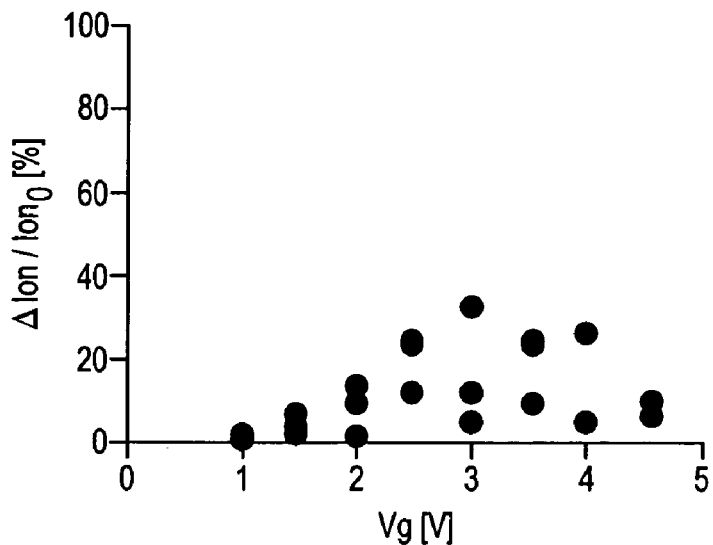
Figure 11A:
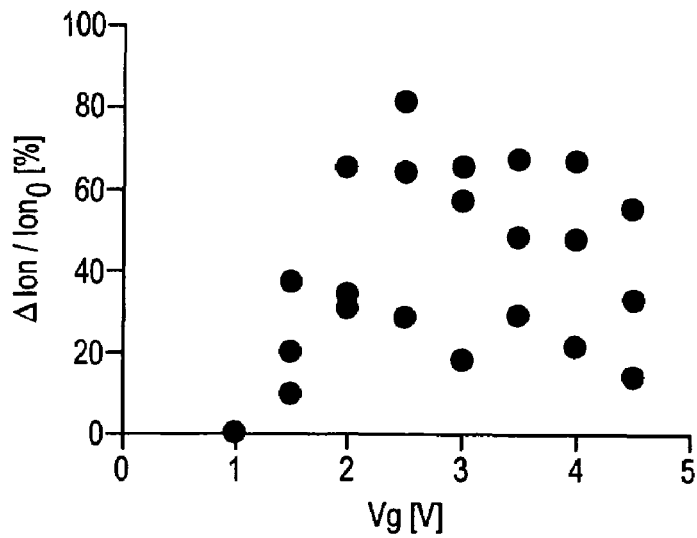
FIGS. 11A and 11B are graphs showing deterioration factors in TFTs (in which the film thickness of the gate insulating film is 60 nm)
Figure 11B:
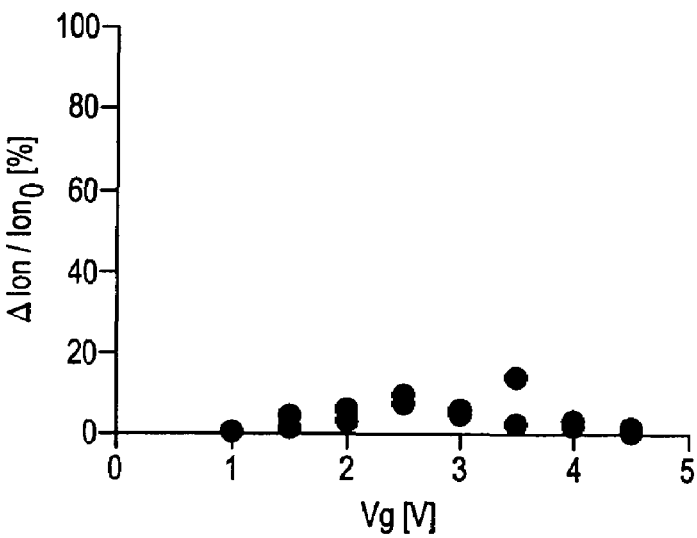
Figure 14:
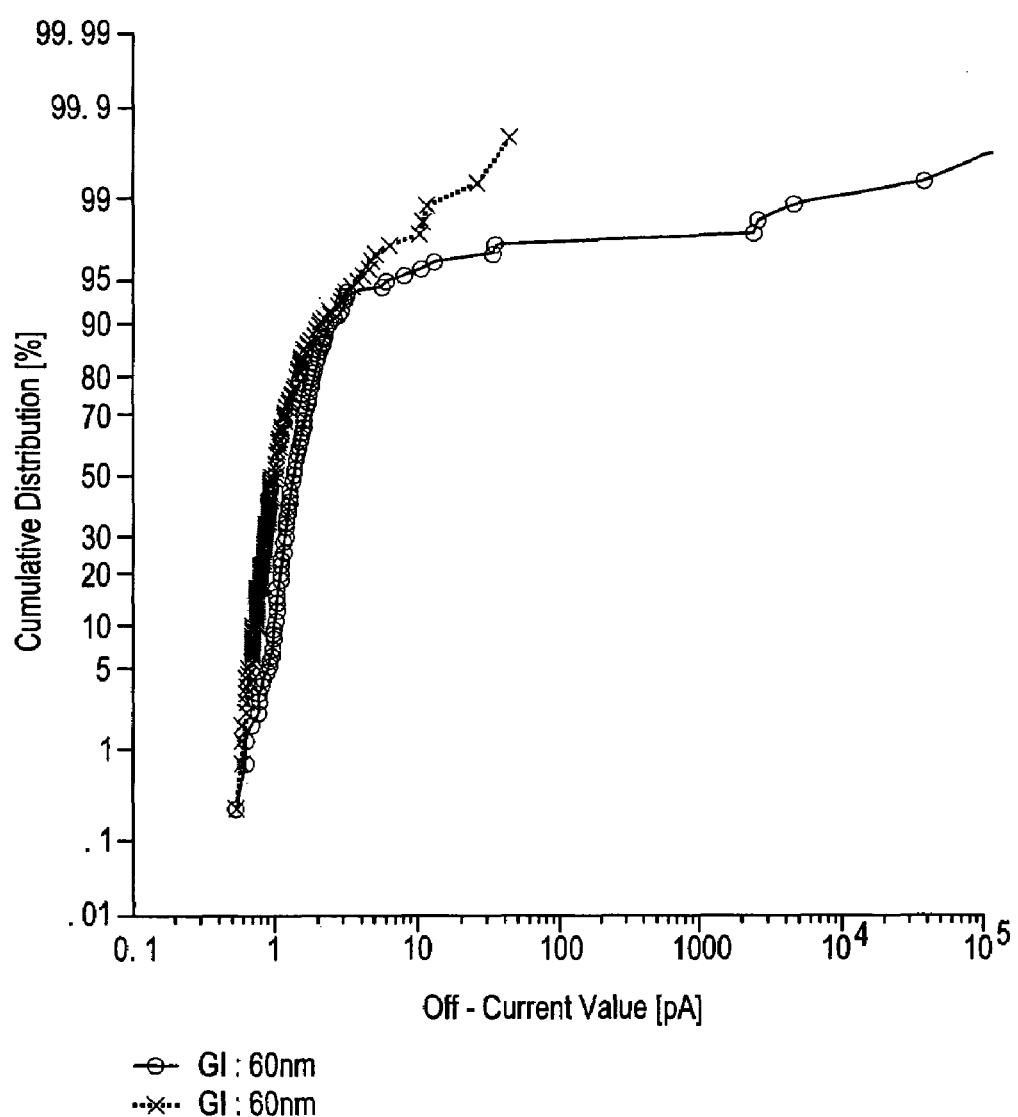
FIG. 14 is a graph showing off current values in TFTs with L/W=2/8 (in which the film thickness of the gate insulating film is 60 nm)
Figure 15:
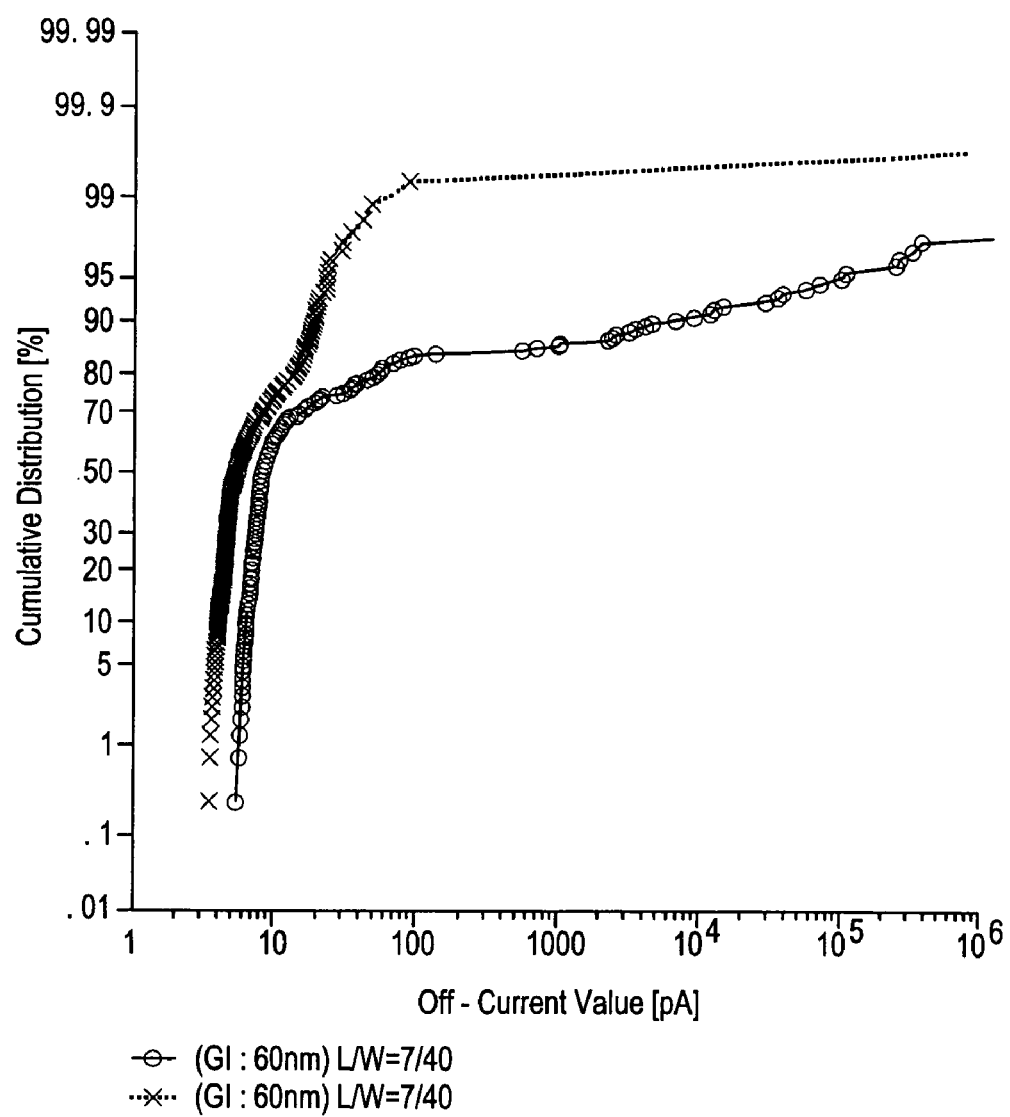
FIG. 15 is a graph showing off current values in TFTs with L/W=7/40 (in which the film thickness of the gate insulating film is 60 nm)

Further, similar comparison is performed when the film thickness of the gate insulating film is varied. FIGS. 10A (comparison example) and 10B (this embodiment) show the on characteristic fluctuation ($Ion/Ion_0$) in the case where the thickness of the gate insulating film is 80 nm and the transient stress is applied at a room temperature for 100 seconds under condition of the drain voltage Vd=+16 V and the gate voltage Vg=1 to 4.5 V. Further, FIGS. 11A (comparison example) and 11B (this embodiment) show the on characteristic fluctuation ($Ion/Ion_0$) in the case where the thickness of the gate insulating film is 60 nm and the transient stress is applied at a room temperature for 100 seconds under the condition of the drain voltage Vd=+20 V and the gate voltage Vg=1 to 4.5 V.

From the above, the reliability can be improved by improving the flatness of the surface of the LDD region. Thus, in the TFT which has the GOLD structure, sufficient reliability can be obtained even if the area of the impurity region that overlaps the gate electrode through the gate insulating film is reduced. Specifically, in the TFT which has the GOLD structure, sufficient reliability can be obtained even if the size of the portion that becomes the tapered portion of the gate electrode is reduced.

Further, FIGS. 12 to 15 show the measurement results of distribution of probability statistics of off-current value with Vd=5 V and Vg=−4.5 V, under the condition that the thickness of the gate insulating films is set to 115 nm, 80 nm, and 60 nm, respectively. Note that, in the figures, the distribution of probability statistics in this embodiment is plotted with "X", and the distribution of probability statistics in the comparison example, in which only the first laser light irradiation is conducted, is plotted with "O". The vertical axis in FIGS. 12 to 15 indicates percentage, and the value at 50% corresponds to the average value of an off current. Further, the horizontal axis indicates an off-current value.

For example, if fluctuation is large, the region occupied by all the plots, namely, the horizontal width, becomes large. In the case where leveling is performed with the second laser light, the reduction in fluctuation of the off-current value is seen more remarkably as the thickness of the gate insulating film becomes thinner. Further, in the case where leveling is performed with the second laser light, the reduction in fluctuation of the off-current value is seen more remarkably in the TFT in FIG. 15 which has channel length L/channel width W=7 µm/40 µm in comparison with the TFTs in FIGS. 12 to 14 which have with L/W=2 µm/8 µm. Therefore, in the case where leveling is performed with the second laser light, fluctuation can be effectively suppressed in the TFT which has a relatively large channel width, for example, the TFT used in a buffer circuit (L/W=7 µm/140 µm, 7 µm/270 µm, 7 µm/400 µm, 7 µm/800 µm, and the like) or the TFT used in an analog switch circuit (L/W=8 µm/400 µm).

From the above, by improving the flatness of the surface of the semiconductor film (including the LDD region), fluctuation of the off current is reduced and the yield of the TFT is enhanced even if the thickness of the gate insulating film is thinned. In the TFT with the GOLD structure, a parasitic capacitance increases when the gate insulating film is thinned. However, the size of the tapered portion of the gate electrode (first conductive layer) is reduced to reduce the parasitic capacitance, whereby the f characteristic is improved to enable high-speed operation and to obtain a TFT which has sufficient reliability.

Incidentally, in the pixel TFT of the pixel portion 207, the reduction in off current and the reduction in fluctuation can be realized by the second laser beam irradiation.

Further, an example of manufacturing the active matrix substrate for forming a reflection type display device is shown in this embodiment. However, if the pixel electrode is formed of a transparent conductive film, a transmission type display device can be formed although one more photo mask is required.

[Embodiment 2]

This Embodiment describes a process of manufacturing an active matrix liquid crystal display device from the active matrix substrate fabricated in Embodiment 1. The description is given with reference to FIG. 16.

After the active matrix substrate as illustrated in FIG. 7 is obtained in accordance with Embodiment 1, an orientation film is formed on the active matrix substrate of FIG. 7 and subjected to rubbing treatment. In this Embodiment, before the orientation film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driver circuit portion. A leveling film is formed to cover the color filter and the light-shielding layer. On the leveling film, an opposite electrode is formed from a transparent conductive film in the pixel portion. An orientation film is formed over the entire surface of the opposite substrate and is subjected to rubbing treatment.

Then the opposite substrate is bonded to the active matrix substrate on which the pixel portion and the driver circuits are formed, using a sealing member. The sealing member has filler mixed therein, and the filler together with the columnar spacers keep the distance between the two substrates. Thereafter, a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 16:
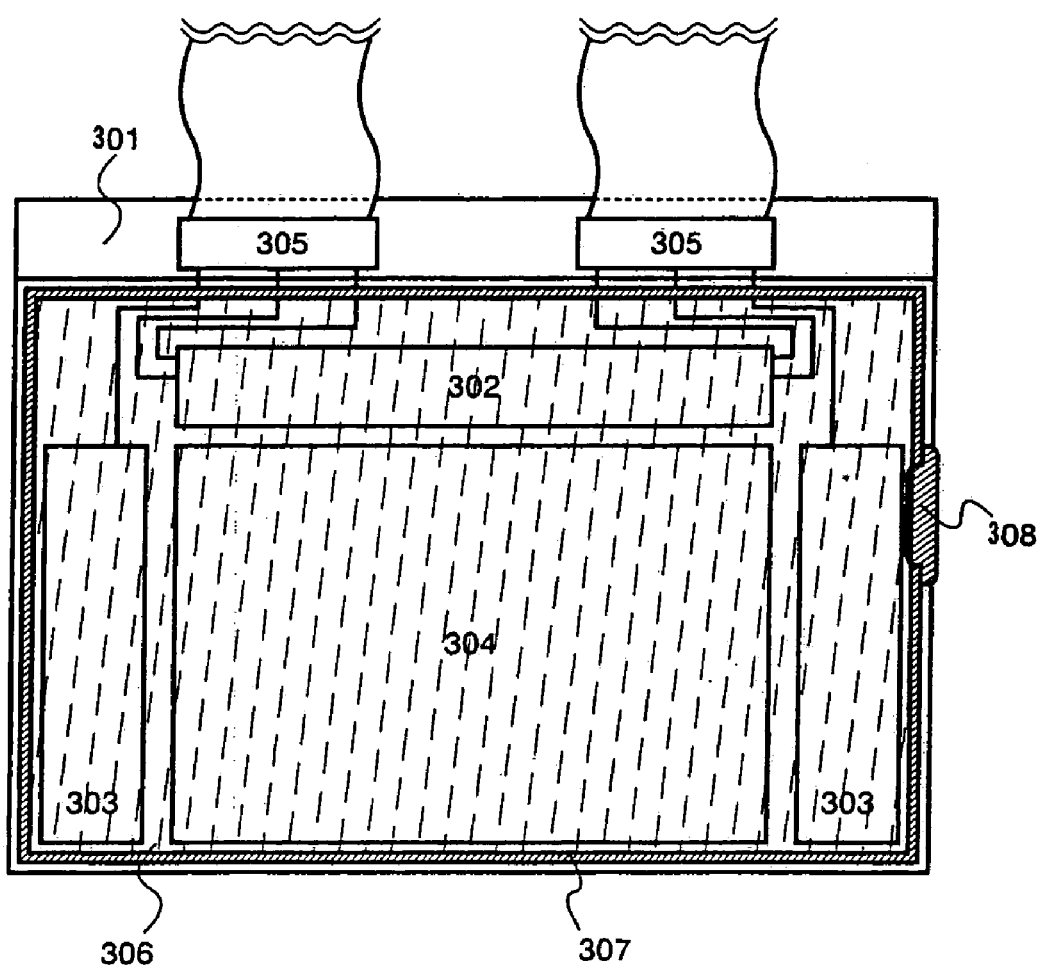
FIG. 16 shows an outline of an AM-LCD (Embodiment 2)

The structure of the thus obtained liquid crystal module is described with reference to the top view in FIG. 16.

A pixel portion 304 is placed in the center of an active matrix substrate 301. A source signal line driver circuit 302 for driving source signal lines is positioned above the pixel portion 304. Gate signal line driver circuits 303 for driving gate signal lines are placed to the left and right of the pixel portion 304. Although the gate signal line driver circuits 303 are symmetrical with respect to the pixel portion in this Embodiment, the liquid crystal module may have only one gate signal line driver circuit at one side of the pixel portion. Of the above two options, a designer can choose the arrangement that suits better considering the substrate size or the like of the liquid crystal module. However, the symmetrical arrangement of the gate signal line driver circuits shown in FIG. 16 is preferred in terms of circuit operation reliability, driving efficiency, and the like.

Signals are inputted to the driver circuits from flexible printed circuits (FPC) 305. The FPCs 305 are press-fit through an anisotropic conductive film or the like so as to reach the wiring lines arranged in predetermined places of the substrate 301 after opening contact holes in the interlayer insulating film and resin film and forming a connection electrode. The connection electrode is formed from ITO in this Embodiment.

A sealing agent 307 is applied to the substrate along its perimeter surrounding the driver circuits and the pixel portion. An opposite substrate 306 is bonded to the substrate 301 by the sealing agent 307 while a spacer formed in advance on the active matrix substrate keeps the distance between the two substrates constant (the distance between the substrate 301 and the opposed substrate 306). Thereafter, a liquid crystal element is injected through a portion of the substrate that is not coated with the sealing agent 307. The substrates are then sealed by an encapsulant 308. The liquid crystal module is completed through the above steps.

Although all of the driver circuits are formed on the substrate in the example shown here, several ICs may be used for some of the driver circuits.

[Embodiment 3]

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driver circuits are formed on the substrate in the example shown here, several ICs may be used for some of the driver circuits.

Figure 17:
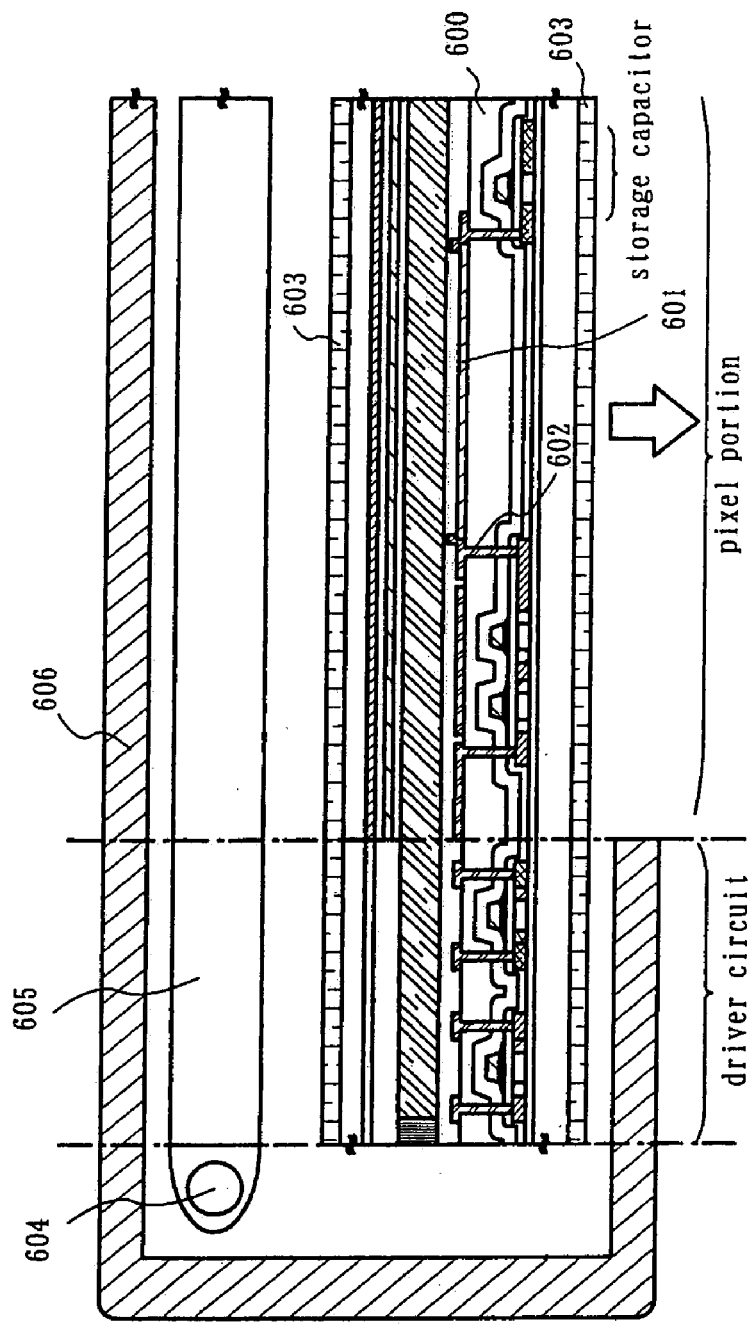
FIG. 17 is a sectional view of an example of a liquid crystal display device (Embodiment 3)

An active matrix substrate is completed as above. A liquid crystal module is manufactured from this active matrix substrate in accordance with Embodiment 2. The liquid crystal module is provided with a backlight 604 and a light guiding plate 605, and is covered with a cover 606 to complete an active matrix liquid crystal display device. A partial sectional view of the active matrix liquid crystal display device is shown in FIG. 17. The cover is bonded to the liquid crystal module using an adhesive or an organic resin. When the substrate to the opposite substrate are bonded, the substrates may be framed so that the space between the frame and the substrates is filled with an organic resin for bonding. Since the display device is of transmissive type, the active matrix substrate and the opposite substrate each needs to have a polarizing plate 603 bonded.

[Embodiment 4]

The driver circuit and the pixel portion formed by implementing the present invention can be used in various modules (active matrix type liquid crystal module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone, electronic book, etc.) and the like. Examples of these are shown in FIGS. 18A to 18F, 19A to 19D, and 20A to 20C.

Figure 18A:
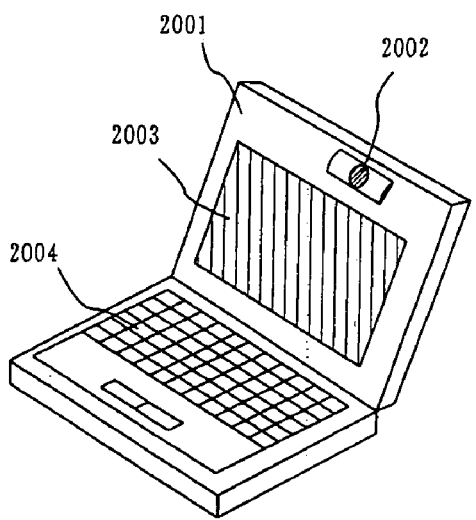
FIGS. 18A to 18F show examples of electronic devices (Embodiment 4)

FIG. 18A shows a personal computer including a main body 2001, an image input portion 2002, a display portion 2003, a keyboard 2004 and the like. Present invention can be applied to the display portion 2003.

Figure 18B:
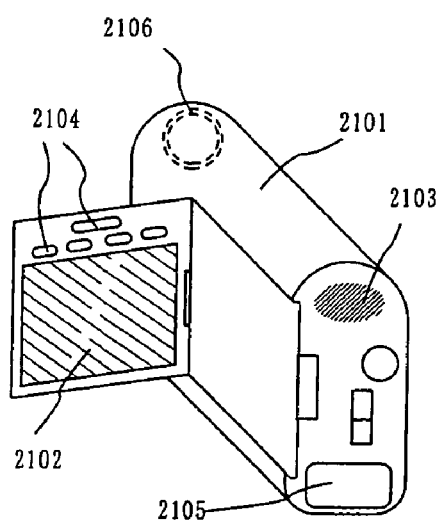

FIG. 18B shows a video camera including a main body 2101, a display portion 2102, a voice input portion 2103, operation switches 2104, a battery 2105, an image receiving portion 2106 and the like. Present invention can be applied to the display portion 2102.

Figure 18C:
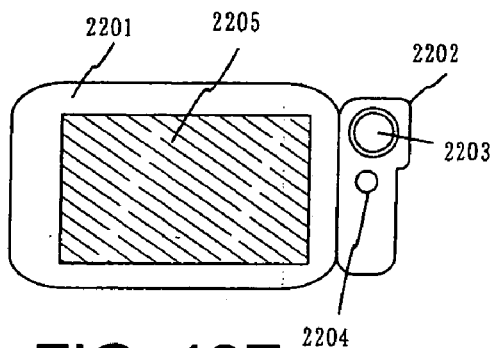

FIG. 18C shows a mobile computer including a main body 2201, a camera portion 2202, an image receiving portion 2203, an operation switch 2204, a display portion 2205 and the like. Present invention can be applied to the display portion 2205.

Figure 18D:
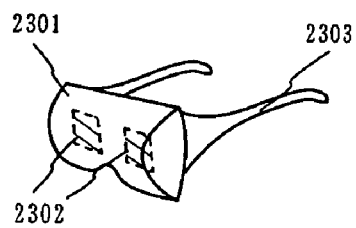

FIG. 18D shows a goggle type display including a main body 2301, a display portion 2302, an arm portion 2303 and the like. Present invention can be applied to the display portion 2302.

Figure 18E:
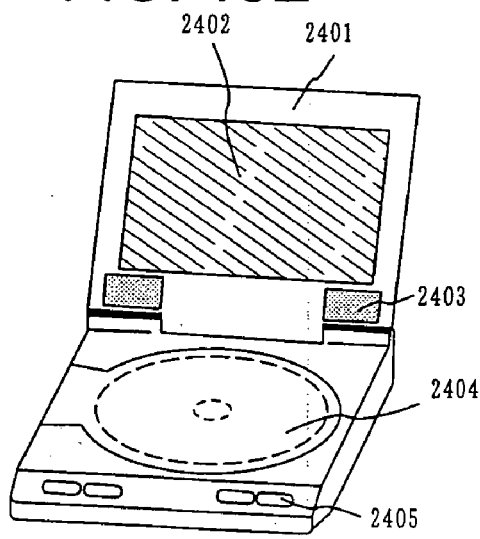

FIG. 18E shows a player using a record medium recorded with programs (hereinafter, referred to as record medium) including a main body 2401, a display portion 2402, a speaker portion 2403, a record medium 2404, an operation switch 2405 and the like. The player uses DVD (digital Versatile Disc) or CD as the record medium and can enjoy music, enjoy movie and carry out game or Internet. Present invention can be applied to the display portion 2402.

Figure 18F:
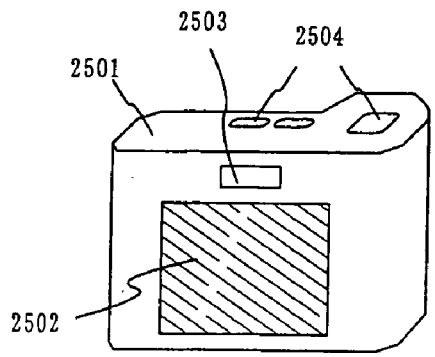

FIG. 18F shows a digital camera including a main body 2501, a display portion 2502, an eye contact portion 2503, operation switches 2504, an image receiving portion (not illustrated) and the like. Present invention can be applied to the display portion 2502.

Figure 19A:
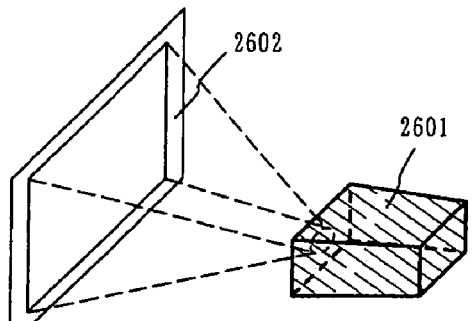
FIGS. 19A to 19D show examples of electronic devices (Embodiment 4)

FIG. 19A shows a front type projector including a projection equipment 2601, a screen 2602 and the like. Present invention can be applied to the liquid crystal module 2808 forming a part of the projection equipment 2601 to complete the equipment entirely.

Figure 19B:
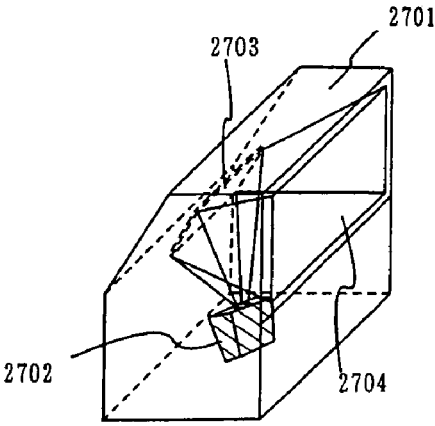

FIG. 19B shows a rear type projector including a main body 2701, a projection equipment 2702, a mirror 2703, a screen 2704 and the like. Present invention can be applied to the liquid crystal module 2808 forming a part of the projection equipment 2702 to complete the equipment entirely.

Figure 19C:
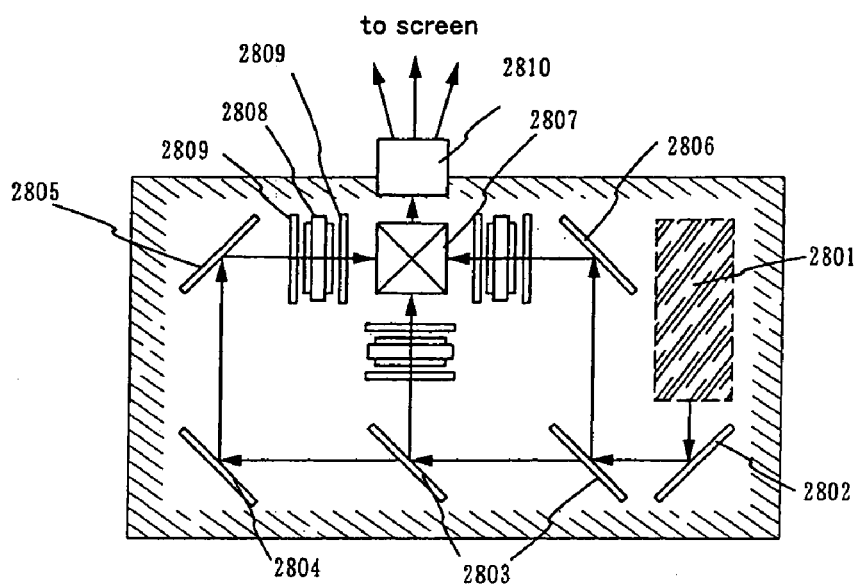

Further, FIG. 19C is a view showing an example of a structure of the projection equipment 2601 and 2702 in FIG. 19A and FIG. 19B. The projection equipment 2601 or 2702 is constituted by a light source optical system 2801, mirrors 2802, and 2804 through 2806, a dichroic mirror 2803, a prism 2807, a liquid crystal module 2808, a phase difference plate 2809 and a projection optical system 2810. The projection optical system 2810 is constituted by an optical system including a projection lens. Although this Embodiment shows an example of three plates type, this Embodiment is not particularly limited thereto but may be of, for example, a single plate type. Further, person of executing this example may pertinently provide an optical system such as an optical lens, a film having a polarization function, a film for adjusting a phase difference, an IR film or the like in an optical path shown by arrow marks in FIG. 19C.

Figure 19D:
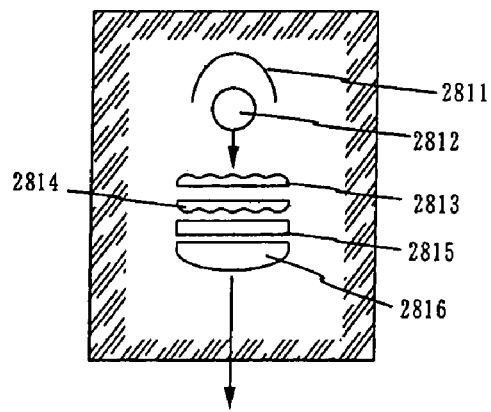

Further, FIG. 19D is a view showing an example of a structure of the light source optical system 2801 in FIG. 19C. According to this Embodiment, the light source optical system 2801 is constituted by a reflector 2811, a light source 2812, lens arrays 2813 and 2814, a polarization conversion element 2815 and a focusing lens 2816. Further, the light source optical system shown in FIG. 19D is only an example and this example is not particularly limited thereto. For example, a person of executing this example may pertinently provide an optical system such as an optical lens, a film having a polarization function, a film for adjusting a phase difference, an IR film or the like in the light source optical system.

However, according to the projectors shown in FIGS. 19A and 19B, there is shown a case of using a transmission type electro-optical device and an example of applying a reflection type electro-optical device is not illustrated.

Figure 20A:
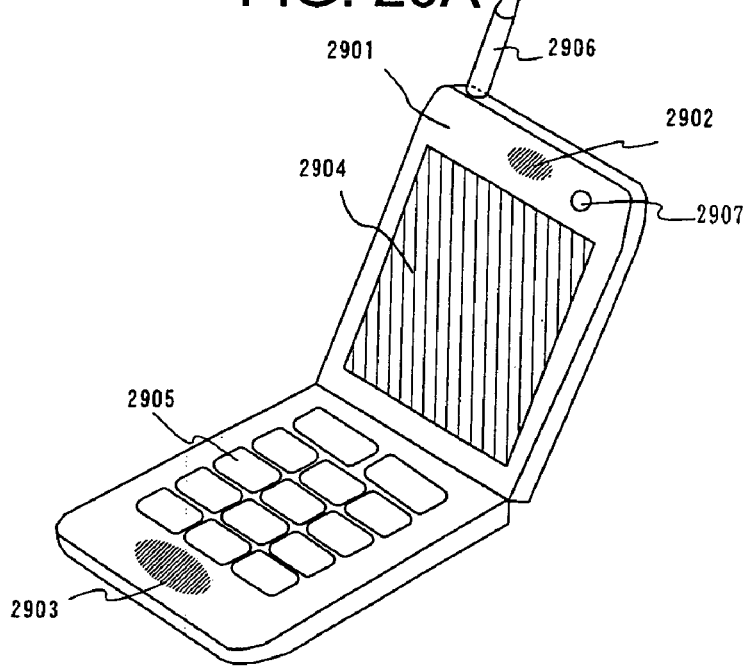
FIGS. 20A to 20C show examples of electronic devices (Embodiment 4)

FIG. 20A shows a cellular phone including a main body 2901, a sound output portion 2902, a sound input portion 2903, a display portion 2904, an operation switch 2905, an antenna 2906, an image input portion (CCD, image sensor or the like) 2907 or the like. Present invention can be applied to the display portion 2904.

Figure 20B:
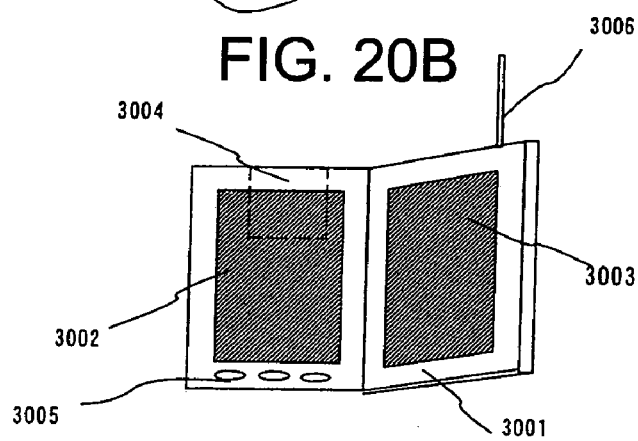

FIG. 20B shows a portable book (electronic book) including a main body 3001, display portions 3002 and 3003, a record medium 3004, an operation switch 3005, an antenna 3006 or the like. Present invention can be applied to the display portions 3002 and 3003.

Figure 20C:
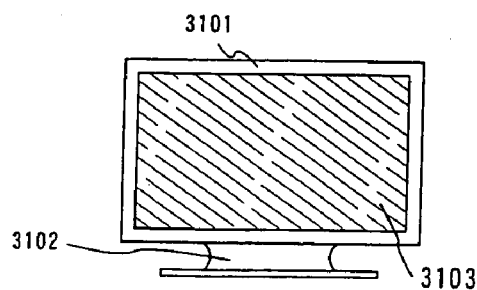

FIG. 20C shows a display including a main body 3101, a support base 3102, a display portion 3103 or the like. Present invention can be applied to the display portion 3103.

In addition, the display shown in FIG. 20C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment in various kinds. The electronic equipment of the present invention can be implemented by freely combined with the structures in Embodiments 1 to 3.

According to the present invention, an off current value can be reduced, reliability can be improved, and an increase in parasitic capacitance due to the unevenness of the surface can be suppressed. In addition, a leak current in the capacitor using the semiconductor layer as one electrode can be reduced and reliability can be improved. Further, according to the present invention, an etching margin for the gate electrode can be increased and variations in electrical characteristics of a TFT (typically, an on current value and an off current value) can be suppressed.

TABLE 1

| | P-V value (nm) | | Ra value (nm) | | Rms (nm) | |
|---|---|---|---|---|---|---|
| AFM measurement area (μm) | 4 × 4 | 50 × 50 | 4 × 4 | 50 × 50 | 4 × 4 | 50 × 50 |
| after 1st laser irradiation | 91.32 | 102.38 | 10.49 | 8.32 | 12.97 | 10.21 |
| after 2nd laser irradiation | 20.23 | 36.45 | 2.14 | 1.29 | 2.61 | 1.73 |

What is claimed is:

1. A semiconductor device comprising a TFT comprising:
a gate electrode;
a gate insulating film;
a channel formation region;
a drain region;
a source region; and
an LDD region which is overlapped with the gate electrode through the gate insulating film interposed therebetween and located between the channel formation region and one of the drain region and the source region,
wherein a surface of the LDD region is flat, and
wherein a P-V value indicating a degree of flatness on the surface of the LDD region is 50 nm or less.

2. A semiconductor device according to claim 1,
wherein the gate electrode comprises a laminate of a first conductive layer and a second conductive layer with a smaller width than the first conductive layer,
wherein the channel formation region is overlapped with the second conductive layer through the first conductive aver and the gate insulating film, and
wherein the LDD region is overlapped with the first conductive layer through the gate insulating film.

3. A semiconductor device according to claim 1,
wherein the gate electrode comprises a laminate of a first conductive layer and a second conductive layer with a smaller width than the first conductive layer,
wherein the channel formation region is overlapped with the second conductive layer through the first conductive layer and the gate insulating film, and
wherein a portion of the LDD region is overlapped with the first conductive layer through the gate insulating film while another portion of the LDD region is not overlapped with the first conductive layer.

4. A semiconductor device according to claim 1,
wherein the gate electrode comprises a laminate of a first conductive layer and a second conductive layer which has a smaller width than the first conductive layer and a larger taper angle than the first conductive layer,
wherein the channel formation region is overlapped with the second conductive layer through the first conductive layer and the gate insulating film, and wherein the LDD region is overlapped with the first conductive layer through the gate insulating film, and has a concentration distribution in which an impurity concentration is increased as a distance from the channel formation region is increased.

5. A semiconductor device according to claim 2, wherein a width of a portion the first conductive layer overlapped with the LDD region through the gate insulating film is 0.5 μm to 1.5 μm.

6. A semiconductor device according to claim 3, wherein a width of a portion of the first conductive layer overlapped with the LDD region through the gate insulating film is 0.5 μm to 1.5 μm.

7. A semiconductor device according to any claim 4, wherein a width of a portion of the first conductive layer overlapped with the LDD region through the gate insulating film is 0.5 μm to 1.5 μm.

8. A semiconductor device comprising a plurality of TFTs each comprising:
a gate electrode;
a gate insulating film;
a channel formation region;
a drain region;
a source region; and
an LDD region which is overlapped with the gate electrode through the gate insulating film interposed therebetween and located between the channel formation region and one of the drain region and the source region,
wherein the plurality of TFTs comprises at least a first TFT and a second TFT,
wherein a width of the LDD region of the first TFT is different from at of the second TFT,
wherein the width of the LDD region of the first TFT is wider than that of the second TFT,
wherein surfaces of the LDD regions of the first and second TFTs are flat, and
wherein a P-V value indicating a degree of flatness on the surface of the LDD region is 50 nm or less.

9. A semiconductor device comprising a pixel portion and a driver circuit,
wherein each of a TFT of the driver circuit and a TFT of the pixel portion comprises a gate electrode, a gate insulating film, a channel formation region, a drain region, a source region, and an LDD region between the channel formation region and one of the drain region and the source region,
wherein the LDD region is overlapped with the gate electrode through the gate insulating film interposed therebetween,
wherein a width of the LDD region of the TFT of the driver circuit is wider than that of the pixel portion,
wherein surfaces of the LDD regions of the TFT of the driver circuit and the TFTs of the pixel portion are flat, and
wherein a P-V value indicating a degree of flatness on the surface of the LDD region is 50 nm or less.

10. A semiconductor device according to claim 8, wherein a P-V value indicating a degree of flatness on the surface of the LDD region is 50 nm or less.

11. A semiconductor device according to claim 9, wherein a P-V value indicating a degree of flatness on the surface of the LDD region is 50 nm or less.

12. A semiconductor device according to any one of claim 8, wherein a width of a portion of the gate electrode overlapped with the LDD region through the gate insulating film is 0.5 μm to 1.5 μm.

13. A semiconductor device according to claim 9, wherein a width of a portion of the gate electrode overlapped with the LDD region through the gate insulating film is 0.5 μm to 1.5 μm.

14. A semiconductor device according to claim 8, wherein the gate electrode comprises a laminate of a first conductive layer and a second conductive layer which has a smaller width and a larger taper angle than the first conductive layer.

15. A semiconductor device according to claim 9, wherein the gate electrode comprises a laminate of a first conductive layer and a second conductive layer which has a smaller width and a larger taper angle than the first conductive layer.

16. A semiconductor device according to claim 2, wherein a thickness of the first conductive layer is 20 nm to 100 nm.

17. A semiconductor device according to claim 3, wherein a thickness of the first conductive layer is 20 nm to 100 nm.

18. A semiconductor device according to claim 4, wherein a thickness of the first conductive layer is 20 nm to 100 nm.

19. A semiconductor device according to claim 14, wherein a thickness of the first conductive layer is 20 nm to 100 nm.

20. A semiconductor device according to claim 15, wherein a thickness of the first conductive layer is 20 nm to 100 nm.

21. A semiconductor device according to claim 2, wherein a film thickness of the second conductive layer is 100 nm to 500 nm.

22. A semiconductor device according to claim 3, wherein a film thickness of the second conductive layer is 100 nm to 500 nm.

23. A semiconductor device according to claim 4, wherein a film thickness of the second conductive layer is 100 nm to 500 nm.

24. A semiconductor device according to claim 14, wherein a film thickness of the second conductive layer is 100 nm to 500 nm.

25. A semiconductor device according to claim 15, wherein a film thickness of the second conductive layer is 100 nm to 500 nm.

26. A semiconductor device comprising a pixel portion comprising:
   a TFT comprising;
      a gate electrode;
      an insulating film;
      a semiconductor layer comprising:
         a channel formation region;
         a drain region;
         a source region; and
         an LDD region between the channel formation region and one of the drain region and the source region; and
   a storage capacitor,
   wherein the LDD region is overlapped with the gate electrode through the insulating film interposed therebetween,
   wherein the pixel portion further comprises a pixel electrode electrically connected with one of the drain region and the source region,
   wherein the storage capacitor in a pixel comprises the insulating film as a dielectric, a semiconductor layer electrically connected with the pixel electrode, and an electrode electrically connected with a gate wiring of an adjacent pixel, and
   wherein a surface of the semiconductor layer electrically connected with the pixel electrode and a surface of the LDD region are flat, and
   wherein a P-V value indicating a degree of flatness on the surface of the semiconductor layer is 50 nm or less.

27. A semiconductor device comprising:
   a TFT comprising a gate electrode, an insulating film, a channel formation region, a drain region, and a source region; and
   a storage capacitor,
   wherein the storage capacitor comprises the insulating film as a dielectric, an electrode comprising a laminate of a first conductive layer and a second conductive layer with a smaller width than the first conductive layer, and a semiconductor layer,
   wherein a surface of a region of the semiconductor layer which is overlapped with the electrode through the insulating film interposed therebetween is flat, and
   wherein a P-V value indicating a degree of flatness on the surface of the semiconductor layer is 50 nm or less.

28. A semiconductor device according to claim 27, wherein the semiconductor layer comprises the same material as one of the channel formation region, the drain region, and the source region.

29. A semiconductor device according to claim 27, wherein the electrode comprises the same material as the gate electrode.

30. A semiconductor device comprising a TFT comprising: a gate electrode; a gate insulating film; a channel formation region; a drain region; a source region; and an LDD region between the channel formation region and one of the drain region and the source region,
   wherein the LDD region is overlapped with the gate electrode through the gate insulating film interposed therebetween,
   wherein a boundary between a portion of the gate electrode overlapped with the LDD region and the gate insulating film is flat, and
   wherein a P-V value indicating a dearee of flatness on the surface of the semiconductor layer is 50 nm or less.

31. A semiconductor device according to claim 1, wherein the semiconductor device is selected from the group consisting of a video camera, a digital camera, a car navigation system, a personal computer, a portable information terminal, and an electronic game machine.

32. A semiconductor device according to claim 2, wherein the semiconductor device is selected from the group consisting of a video camera, a digital camera, a car navigation system, a personal computer, a portable information terminal, and an electronic game machine.

33. A semiconductor device according to claim 3, wherein the semiconductor device is selected from the group consisting of a video camera, a digital camera, a car navigation system, a personal computer, a portable information terminal, and an electronic game machine.

34. A semiconductor device according to claim 4, wherein the semiconductor device is selected from the group consisting of a video camera, a digital camera, a car navigation system, a personal computer, a portable information terminal, and an electronic game machine.

35. A semiconductor device according to claim 8, wherein the semiconductor device is selected from the group consisting of a video camera, a digital camera, a car navigation system, a personal computer, a portable information terminal, and an electronic game machine.

36. A semiconductor device according to claim 9, wherein the semiconductor device is selected from the group consisting of a video camera, a digital camera, a car navigation system, a personal computer, a portable information terminal, and an electronic game machine.

37. A semiconductor device according to claim 27, wherein the semiconductor device is selected from the group consisting of a video camera, a digital camera, a car navigation system, a personal computer, a portable information terminal, and an electronic game machine.

38. A semiconductor device according to claim 26, wherein the semiconductor device is selected from the group consisting of a video camera, a digital camera, a car navigation system, a personal computer, a portable information terminal, and an electronic game machine.

39. A semiconductor device according to claim 30, wherein the semiconductor device is selected from the group consisting of a video camera, a digital camera, a car navigation system, a personal computer, a portable information terminal, and an electronic game machine.

40. A semiconductor device according to claim 1, wherein a thickness of the gate insulating film is at least 60 nm.

41. A semiconductor device according to claim 2, wherein a thickness of the gate insulating film is at least 60 nm.

42. A semiconductor device according to claim 3, wherein a thickness of the gate insulating film is at least 60 nm.

43. A semiconductor device according to claim 4, wherein a thickness of the gate insulating film is at least 60 nm.

44. A semiconductor device according to claim 8, wherein a thickness of the gate insulating film is at least 60 nm.

45. A semiconductor device according to claim 9, wherein a thickness of the gate insulating film is at least 60 nm.

46. A semiconductor device according to claim 30, wherein a thickness of the gate insulating film is at least 60 nm.

47. A semiconductor device according to claim 1, wherein a size of the channel formation region is set to channel length L/channel width W=7 µm/40 µm or larger.

48. A semiconductor device according to claim 2, wherein a size of the channel formation region is set to channel length L/channel width W=7 µm/40 µm or larger.

49. A semiconductor device according to claim 3, wherein a size of the channel formation region is set to channel length L/channel width W=7 µm/40 µm or larger.

50. A semiconductor device according to claim 4, wherein a size of the channel formation region is set to channel length L/channel width W=7 µm/40 µm or larger.

51. A semiconductor device according to claim 8, wherein a size of the channel formation region is set to channel length L/channel width W=7 µm/40 µm or larger.

52. A semiconductor device according to claim 9, wherein a size of the channel formation region is set to channel length L/channel width W=7 µm /40 µm or larger.

53. A semiconductor device according to claim 30, wherein a size of the channel formation region is set to channel length L/channel width W=7 µm/40 µm or larger.

* * * * *

UNITED STATES PATENT AND TRADEMARK OFFICE
CERTIFICATE OF CORRECTION

PATENT NO.         : 7,141,823 B2                                            Page 1 of 1
APPLICATION NO. : 10/254670
DATED              : November 28, 2006
INVENTOR(S)        : Takashi Hamada et al.

It is certified that error appears in the above-identified patent and that said Letters Patent is hereby corrected as shown below:

On the Title page item (73), Assignee, after "Semiconductor Energy Laboratory Co., Ltd., Kanagawa-ken (JP)," insert --; Sharp Kabushiki Kaisha, Osaka (JP)--.

Signed and Sealed this

First Day of May, 2007

JON W. DUDAS
*Director of the United States Patent and Trademark Office*